US012804912B2

(12) United States Patent
Huang et al.

(10) Patent No.: US 12,804,912 B2
(45) Date of Patent: Nov. 17, 2026

(54) CHIP PACKAGE AND METHODS FOR FORMING THE SAME

(71) Applicant: Taiwan Semiconductor Manufacturing Company Limited, Hsinchu (TW)

(72) Inventors: Kuan-Yu Huang, Taipei (TW); Sung-Hui Huang, DongshanTownship (TW); Kuo-Chiang Ting, Hsinchu City (TW); Chia-Hao Hsu, Hsinchu (TW); Hsien-Pin Hsu, Zhubei City (TW); Chih-Ta Shen, Hsinchu (TW); Shang-Yun Hou, Jubei City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 723 days.

(21) Appl. No.: 18/303,641

(22) Filed: Apr. 20, 2023

(65) Prior Publication Data

US 2024/0099030 A1 Mar. 21, 2024

Related U.S. Application Data

(60) Provisional application No. 63/408,035, filed on Sep. 19, 2022.

(51) Int. Cl.
*H10B 80/00* (2026.01)
*H10W 70/60* (2026.01)
(Continued)

(52) U.S. Cl.
CPC .......... *H10B 80/00* (2023.02); *H10W 70/611* (2026.01); *H10W 70/685* (2026.01); (Continued)

(58) Field of Classification Search
None
See application file for complete search history.

(56) References Cited

U.S. PATENT DOCUMENTS 11,201,097 B2 * 12/2021 Huang .................... H10P 54/00
11,574,861 B2 * 2/2023 Wang .................. H10W 42/121
(Continued)

FOREIGN PATENT DOCUMENTS

| | | | |
|---|---|---|---|
| CN | 113451230 | A | 9/2021 |
| TW | I752881 | B | 1/2022 |
| TW | 202213689 | A | 4/2022 |

OTHER PUBLICATIONS

Jianq Chyun Intellectual Property Office; TW Application No. 112122376, 1st Office Action mailed Aug. 1, 2024; 12 pages.

*Primary Examiner* — Long Pham
(74) *Attorney, Agent, or Firm* — The Marbury Law Group, PLLC

(57) ABSTRACT

A bonded assembly includes an interposer; a semiconductor die that is attached to the interposer and including a planar horizontal bottom surface and a contoured sidewall; a high bandwidth memory (HBM) die that is attached to the interposer; and a dielectric material portion contacting the semiconductor die and the interposer. The contoured sidewall includes a vertical sidewall segment and a non-horizontal, non-vertical surface segment that is adjoined to a bottom edge of the vertical sidewall segment and is adjoined to an edge of the planar horizontal bottom surface of the semiconductor die. The vertical sidewall segment and the non-horizontal, non-vertical surface segment are in contact with the dielectric material portion. The contoured sidewall may provide a variable lateral spacing from the HBM die to reduce local stress in a portion of the HBM die that is proximal to the interposer.

20 Claims, 26 Drawing Sheets

(51) Int. Cl.

| | |
|---|---|
| ***H10W 70/685*** | (2026.01) |
| ***H10W 74/10*** | (2026.01) |
| ***H10W 90/00*** | (2026.01) |
| *H10W 90/20* | (2026.01) |

(52) U.S. Cl.

CPC ........... *H10W 74/10* (2026.01); *H10W 90/00* (2026.01); *H10W 90/20* (2026.01); *H10W 90/724* (2026.01)

(56) References Cited

U.S. PATENT DOCUMENTS

2008/0006900 A1* 1/2008 Chan .................. H10W 74/114
257/E23.125
2018/0350754 A1* 12/2018 Huang ................ H10W 42/121
2020/0006178 A1* 1/2020 Huang .................... H10P 54/00
2020/0278065 A1* 9/2020 Danielson ............... F16L 37/47

* cited by examiner

CHIP PACKAGE AND METHODS FOR FORMING THE SAME

RELATED APPLICATIONS

This application claims priority from U.S. Provisional Application Ser. No. 63/408,035 entitled "Chip Package and Methods For Forming The Same," filed on Sep. 19, 2022, the entire contents of which are incorporated herein by reference for all purposes.

BACKGROUND

Stress in a chip package including multiple semiconductor dies may cause cracks or delamination between semiconductor dies and dielectric material portions such as underfill material portions or molding compound die frames. Such cracks and/or delamination adversely affect the reliability of chip packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1B:
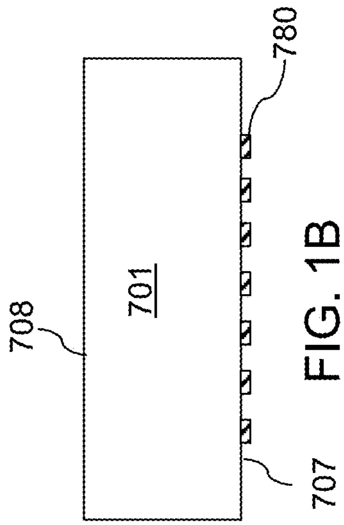
FIG. 1B is a second vertical cross-sectional view of the semiconductor die along the vertical plane B-B' of FIG. 1C.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to semiconductor devices, and particularly to a chip package including a plurality of semiconductor dies having at least one contoured sidewall configured to reduce mechanical stress on an adjacent die such as a memory die. Each contoured sidewall may comprise a beveled surface or a convex surface, and may provide a configuration that increase a minimum lateral spacing between hard materials such as silicon substrates or metal interconnects. In some embodiments, the countered sidewall may also be referred to as a contoured bottom surface. The contoured bottom surface may comprise a beveled surface of a convex surface.

An embodiment of the present disclosure may be used to integrate a semiconductor die including a logic circuit (such as an SoC die) with a memory die into a chip package (such as a high bandwidth memory (HBM) die) such that the memory die may be placed in proximity to the semiconductor die. A chip package may include a bonded assembly of an interposer, at least one semiconductor die (which may include a single semiconductor die or a plurality of semiconductor dies), and at least one HBM die (which may include a single HBM die or a plurality of HBM dies). Each contoured sidewall of a semiconductor die may face a respective vertical sidewall of a respective HBM die, and may have a contour that reduces the mechanical stress on a corner of the respective HBM die, such as a corner of a controller die within the respective HBM die that has a greater lateral extent than overlying random access memory dies within the respective HBM die.

The interposers may be of any kind known in the art. For example, the interposer may be an organic interposer, a silicon interposer, an interposer including at least one local silicon interconnect (LSI) die, or a composite interposer. The at least one semiconductor die and the at least one HBM die may be assembled over an interposer, or an interposer may be formed over a reconstituted wafer including the at least one semiconductor die and the at least one HBM die. The various aspects and embodiments of the methods and structures of the present disclosure are described with reference to accompanying drawings herebelow.

Figure 1A:
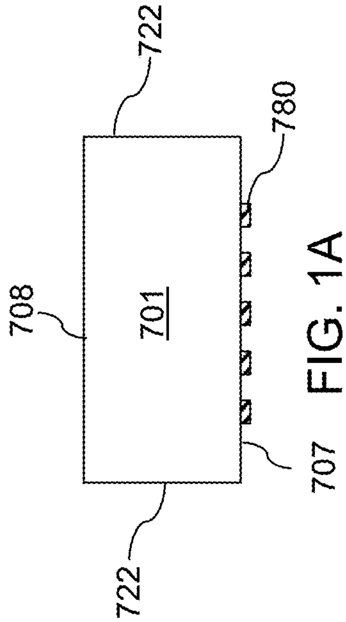
FIG. 1A is a first vertical cross-sectional view of a semiconductor die along the vertical plane A-A' of FIG. 1C according to an embodiment of the present disclosure.
Figure 1C:
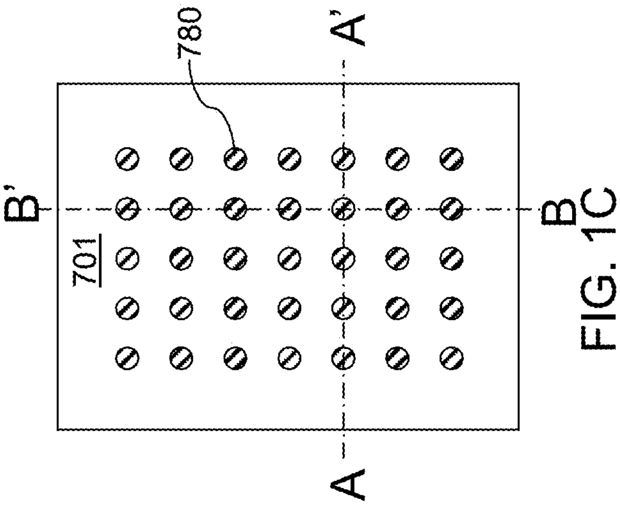
FIG. 1C is a bottom-up view of the semiconductor die of FIGS. 1A and 1B.

Referring to FIGS. 1A-1C, a semiconductor die 701 is illustrated. The semiconductor die 701 may be any type of semiconductor die. In one embodiment, the semiconductor die 701 may comprise a logic circuit containing complementary metal oxide semiconductor (CMOS) devices therein. For example, the semiconductor die 701 may comprise a system-on-chip (SoC) die. The semiconductor die 701 may comprise a planar horizontal bottom surface 707, a planar horizontal top surface 708, and straight vertical sidewalls which are herein referred to as vertical semiconductor-die sidewalls 722. Bonding pads, which are herein referred to as on-die bump structures 780, are provided on the planar horizontal bottom surface 707. Horizontal surfaces of the on-die bump structures 780 may be located within the horizontal plane including the planar horizontal bottom surface 707. In one embodiment, the on-die bump structures 780 may protrude downward from the horizontal plane including the planar horizontal bottom surface 707. In another embodiment, the on-die bump structures 780 may be embedded within a dielectric material layer in the semiconductor die 701 such that the physically exposed planar surfaces of the on-die bump structures 780 are located within the horizontal plane including the planar horizontal bottom surface 707.

Figure 2B:
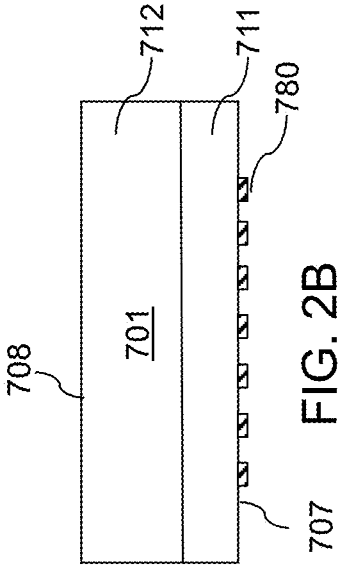
FIG. 2B is a second vertical view of the semiconductor die as viewed from the right of FIG. 2A.
Figure 2A:
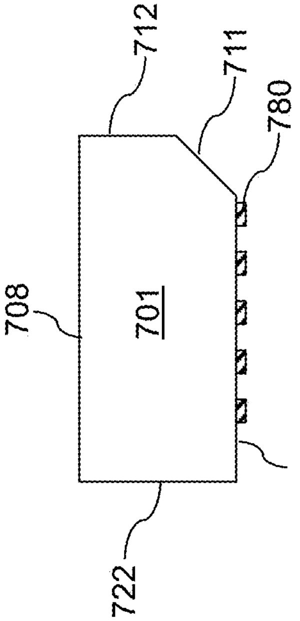
FIG. 2A is a first vertical cross-sectional view of a semiconductor die along the vertical plane A-A' of FIG. 2C after formation of a contoured sidewall according to an embodiment of the present disclosure.
Figure 2C:
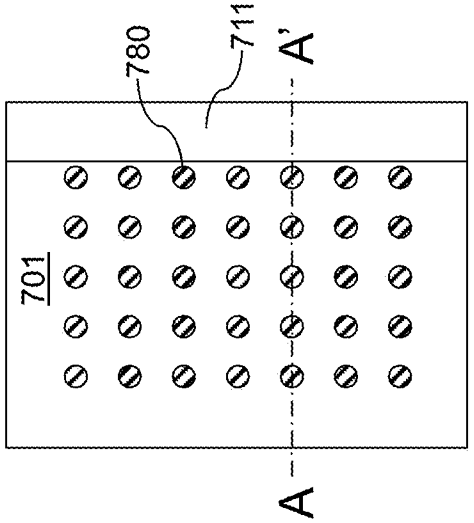
FIG. 2C is a bottom-up view of the semiconductor die of FIGS. 2A and 2B.

Referring to FIGS. 2A-2C, at least one contoured sidewall (711, 712) may be formed on the semiconductor die 701 by modifying at least one vertical semiconductor-die sidewall 722. Specifically, a bottom portion of at least one vertical semiconductor-die sidewall 722 may be ground, polished, and/or cut by mechanical means or by laser ablation. A polishing process, a grinding process, and/or a cutting process may be performed to remove the material of the bottom portion of the at least one vertical semiconductor-die sidewall 722. Generally, the semiconductor die 701 may be designed such that the removed portion of the semiconductor die 701 does not include active devices or metal interconnect structures.

According to an aspect of the present disclosure, the removed portion of each vertical semiconductor-die sidewall 722 is proximal to the planar bottom horizontal surface 707, and is spaced from the planar top horizontal surface 708. Thus, each contoured sidewall (711, 712) comprises a vertical sidewall segment 712 that is an intact portion of a vertical semiconductor-die sidewall 722, and comprises an additional surface segment that is formed by removal of the material of the semiconductor die 701. The additional surface segment is not horizontal, and is not vertical, and is herein referred to as a non-horizontal, non-vertical surface segment 711. As used herein, a “non-horizontal, non-vertical surface segment” refers to a surface segment that may not be contained within a horizontal plane, and may not be contained within a vertical plane. Generally, each contoured sidewall (711, 712) of the semiconductor die 701 comprises a vertical sidewall segment 712 and a non-horizontal, non-vertical surface segment 711 that is adjoined to a bottom edge of the vertical sidewall segment 712 and is adjoined to an edge of the planar horizontal bottom surface 707. The top edge of the non-horizontal, non-vertical surface segment may be vertically spaced from the horizontal plane including the planar horizontal bottom surface 707 of the semiconductor die 701 by a vertical spacing that is in a range from 1% to 50%, such as from 2% to 30%, and/or from 4% to 20%, of the vertical spacing between the planar horizontal bottom surface 707 and the planar horizontal top surface 708.

Generally, one or more contoured sidewalls (711, 712) may be formed on the semiconductor die 701. According to an aspect of the present disclosure, the one or more contoured sidewalls (711, 712) may be formed on sides of the semiconductor die 701 that faces a respective memory die upon subsequent integration into a chip package such as a fan-out package. Thus, a semiconductor die 701 may be modified to form a single contoured sidewall (711, 712), two contoured sidewalls (711, 712) that may, or may not, be adjoined to each other, three contoured sidewalls (711, 712), or four contoured sidewalls (711, 712). Accordingly, a semiconductor die 701 after the processing steps of FIGS.

2A-2C may have three vertical semiconductor-side sidewall 722, two vertical semiconductor-side sidewalls 722, a single vertical semiconductor-side sidewall 722, or no vertical semiconductor-side sidewall. Each contoured sidewall (711, 712) vertically extends from the planar horizontal bottom surface 707 to the planar horizontal top surface 708 of the semiconductor die 701.

In one embodiment, each the non-horizontal, non-vertical surface segment 711 may be independently formed as a beveled planar surface segment that is at a constant angle with respect to a horizontal plane including the planar horizontal bottom surface 707, the constant angle being in a range from 15 degrees to 75 degrees, such as from 30 degrees to 60 degrees, or as a convex surface segment having a convex profile in a vertical cross-sectional view and having a straight edge in a horizontal cross-sectional view. Thus, one, a plurality, or each of the non-horizontal, non-vertical surface segment(s) 711 may be formed as a respective beveled planar surface segment that is at a constant angle with respective to a horizontal plane including the planar horizontal bottom surface 707, the constant angle being in a range from 15 degrees to 75 degrees, such as from 30 degrees to 60 degrees. Alternatively, or additionally, one, a plurality, or each of the non-horizontal, non-vertical surface segment(s) 711 may be formed as a respective convex surface segment having a convex profile in a vertical cross-sectional view and having a straight edge in a horizontal cross-sectional view. In some embodiments the beveled planar surface segment may be at a constant angle with respect to a vertical sidewall portion 712.

Figure 3:
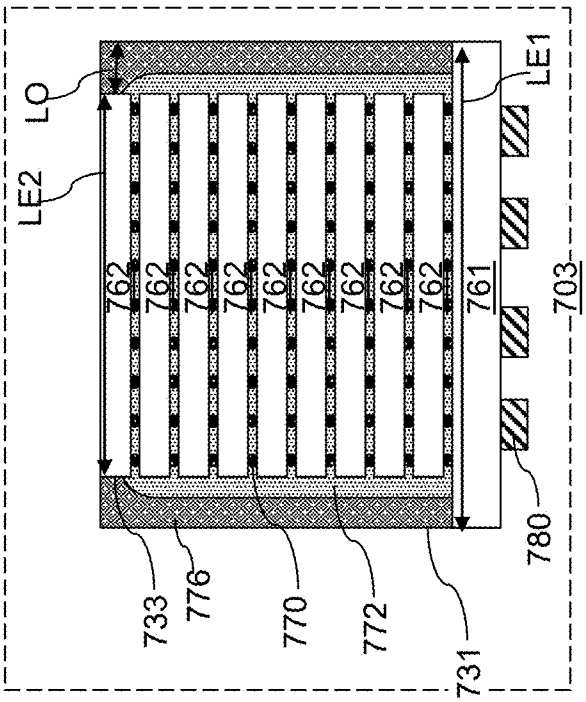
FIG. 3 is a vertical cross-sectional view of a high bandwidth memory (HBM) die according to an embodiment of the present disclosure.

Referring to FIG. 3 and according to an aspect of the present disclosure, at least one high bandwidth memory (HBM) die 703 is provided. The HBM die 703 may include a vertical stack of component dies (761, 762), which may include a controller die 761 and a vertical stack of random access memory dies 762. The random access memory dies 762 may comprise static random access memory dies or dynamic random access memory dies. In one embodiment, each HBM die 703 may comprise a controller die 761 having a first lateral extent LE1, and a plurality of random access memory dies 762 that are stacked over the controller die 761. Each of the plurality of random access memory dies 762 having a second lateral extent LE2 that is less than the first lateral extent LE1. In one embodiment, the controller die 761 and the plurality of random access memory dies 762 are interconnected to one another by arrays of bump structures 770. In one embodiment, the bump structures 770 may comprise microbump structures, i.e., C2 bump structures.

In one embodiment, each HBM die 703 may comprise at least one HBM underfill material portion 772 laterally surrounding the arrays of bump structures 770. The at least one HBM underfill material portion 772 may be a single contiguous HBM underfill material portion that laterally surrounds each of the arrays of bump structures 770 in a respective HBM die 703, or may comprise a plurality of HBM underfill material portions that laterally surround a respective array of bump structures 770. Each HBM die 703 may comprise an HBM molding compound matrix 776 that laterally surrounds the plurality of random access memory dies 762. In one embodiment, sidewalls of the HBM molding compound matrix 776 are vertically coincident with sidewalls of the controller die 761. As used herein, a first surface and a second surface are "vertically coincident" in instances in which the second surface overlies or underlies the first surface, and there exists a vertical plane including the first surface and the second surface. In this embodiment, a lateral extent of an HBM die 703 may be the same as a lateral extent of a controller die 761, i.e., a first lateral extent LE1. In one embodiment, each lateral extent of an HBM die 703 may be the same as the lateral extent of a controller die 761 therein along a same horizontal direction. In one embodiment, each lateral extent of a random access memory die 762 may be less than the lateral extent of the controller die 761 within the same HBM die 703 along any horizontal direction.

Each HBM die 703 may comprise a set of vertical sidewalls, which are herein referred to as vertical HBM-die sidewalls 731. Each vertical HBM-die sidewall 731 may comprise one of the sidewalls of the HBM molding compound matrix 776 and one of the sidewalls of the controller die 761. Each HBM die 703 may comprise a set of four vertical HBM-die sidewalls 731. Each vertical HBM-die sidewall 731 may be laterally spaced from most proximal sidewalls of selected from the sidewalls 733 of the random access memory dies 762 by a lateral offset distance LO, which may be in a range from 100 microns to 1 mm, such as from 150 microns to 600 microns.

Figure 4A:
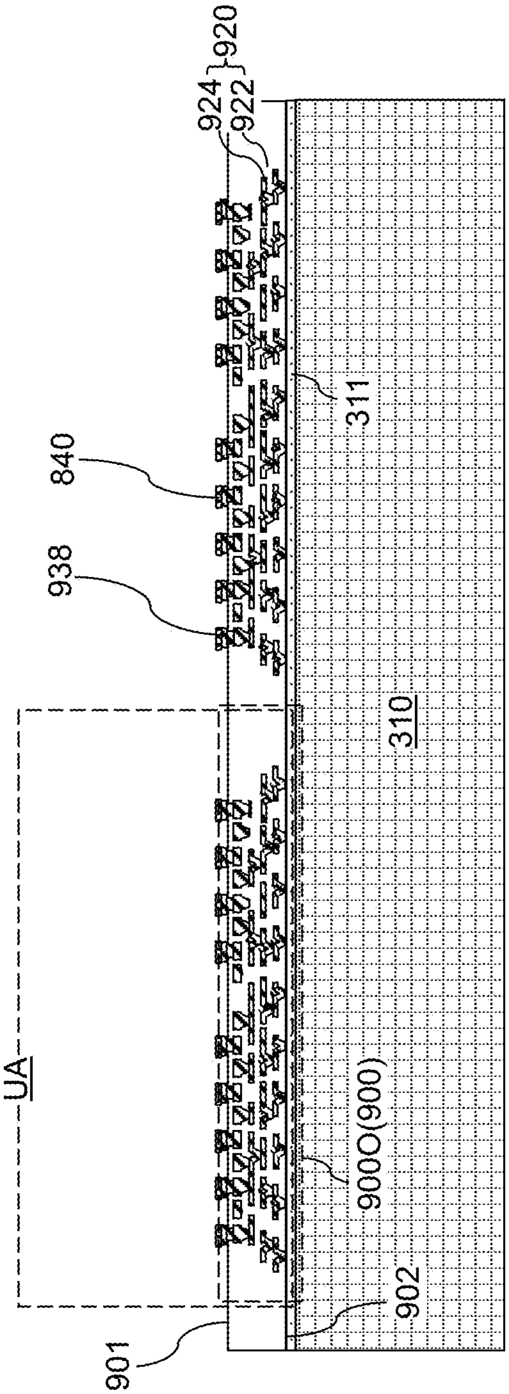
FIG. 4A is a vertical cross-sectional view of a first structure including an array of organic interposers formed on a carrier substrate according to a first embodiment of the present disclosure.
Figure 4B:
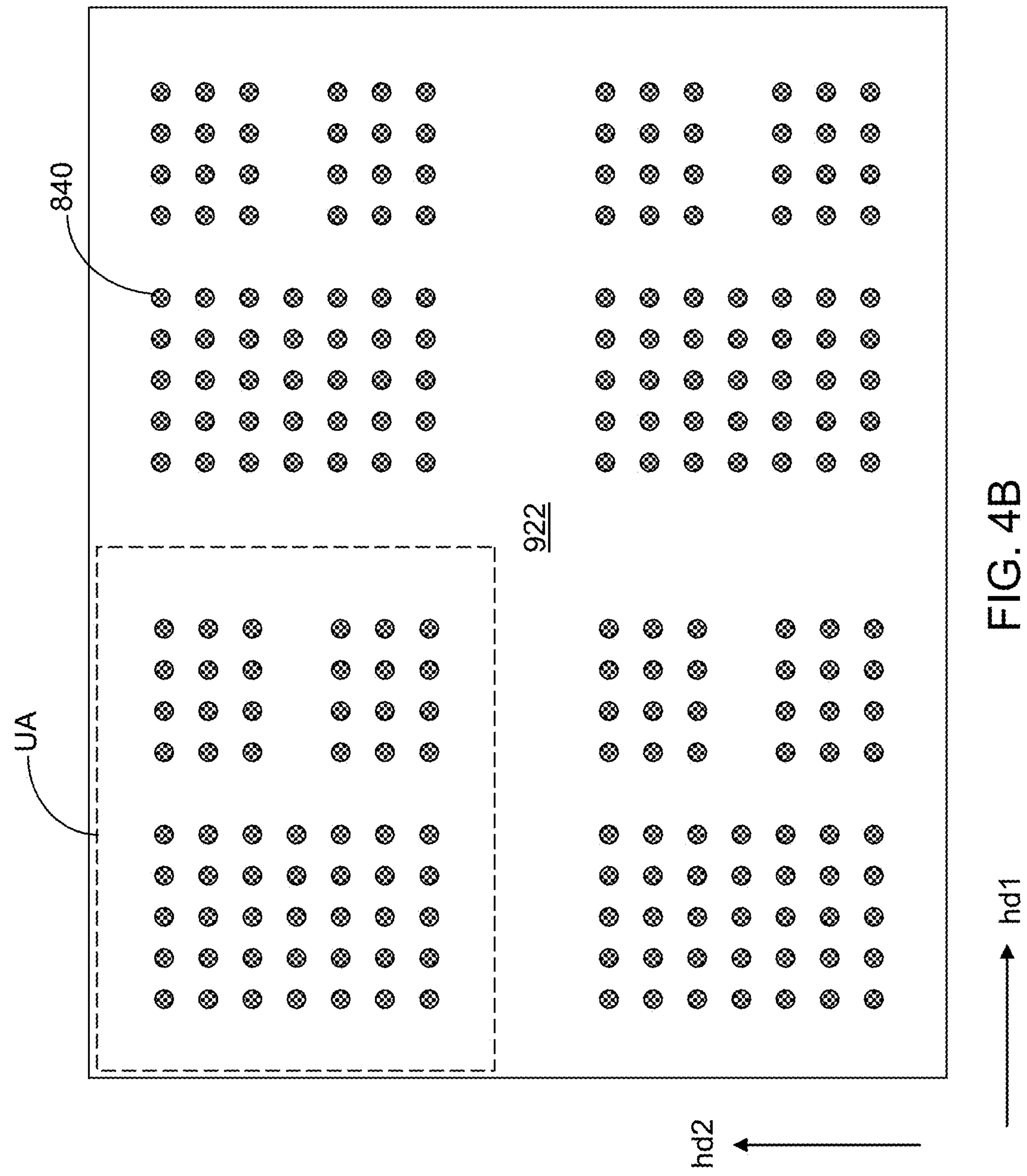
FIG. 4B is a top-down view of the first structure of FIG. 4A.

Referring to FIGS. 4A and 4B, a first structure according to an embodiment of the present disclosure may include a first carrier substrate 310 and interposers 900 formed on a front side surface of the first carrier substrate 310. The first carrier substrate 310 may include an optically transparent substrate such as a glass substrate or a sapphire substrate. The diameter (or width in embodiments in which the first carrier substrate 310 is a square or rectangle) of the first carrier substrate 310 may be in a range from 150 mm to 290 mm, although lesser and greater diameters may be used. In addition, the thickness of the first carrier substrate 310 may be in a range from 500 microns to 2,000 microns, although lesser and greater thicknesses may also be used. Alternatively, the first carrier substrate 310 may be provided in a rectangular panel format. The dimensions of the first carrier in such alternative embodiments may be substantially the same.

A first adhesive layer 311 may be applied to the front-side surface of the first carrier substrate 310. In one embodiment, the first adhesive layer 311 may be a light-to-heat conversion (LTHC) layer. The LTHC layer may be a solvent-based coating applied using a spin coating method. The LTHC layer may convert ultraviolet light to heat, which may cause the material of the LTHC layer to lose adhesion. Alternatively, the first adhesive layer 311 may include a thermally decomposing adhesive material. For example, the first adhesive layer 311 may include an acrylic pressure-sensitive adhesive that decomposes at an elevated temperature. The debonding temperature of the thermally decomposing adhesive material may be in a range from 150 degrees to 200 degrees Celsius.

Interposers 900 may be formed over the first adhesive layer 311. Specifically, an interposer 900 may be formed within each unit area UA, which is the area of a repetition unit that may be repeated in a two-dimensional array over the first carrier substrate 310. Each interposer 900 includes a respective portion of a redistribution structure 920, which is a combination of redistribution dielectric layers 922 and redistribution wiring interconnects 924. The redistribution dielectric layers 922 include a respective dielectric polymer material such as polyimide (PI), benzocyclobutene (BCB), or polybenzobisoxazole (PBO). Other suitable materials may be within the contemplated scope of disclosure. In this embodiment, the interposers 900 may be organic interposers 9000. Each redistribution dielectric layer 922 may be formed by spin coating and drying of the respective dielectric polymer material. The thickness of each redistribution dielectric layer 922 may be in a range from 2 microns to 40 microns, such as from 4 microns to 20 microns. Each redistribution dielectric layer 922 may be patterned, for example, by applying and patterning a respective photoresist layer thereabove, and by transferring the pattern in the photoresist layer into the redistribution dielectric layer 922 using an etch process such as an anisotropic etch process. The photoresist layer may be subsequently removed, for example, by ashing.

Each of the redistribution wiring interconnects 924 may be formed by depositing a metallic seed layer by sputtering, by applying and patterning a photoresist layer over the metallic seed layer to form a pattern of openings through the photoresist layer, by electroplating a metallic fill material (such as copper, nickel, or a stack of copper and nickel), by removing the photoresist layer (for example, by ashing), and by etching portions of the metallic seed layer located between the electroplated metallic fill material portions. The metallic seed layer may include, for example, a stack of a titanium barrier layer and a copper seed layer. The titanium barrier layer may have thickness in a range from 50 nm to 500 nm, and the copper seed layer may have a thickness in a range from 50 nm to 500 nm. The metallic fill material for the redistribution wiring interconnects 924 may include copper, nickel, or copper and nickel. Other suitable metallic fill materials are within the contemplated scope of disclosure. The thickness of the metallic fill material that is deposited for each redistribution wiring interconnect 924 may be in a range from 2 microns to 40 microns, such as from 4 microns to 10 microns, although lesser or greater thicknesses may also be used. The total number of levels of wiring in each interposer 900 (i.e., the levels of the redistribution wiring interconnects 924) may be in a range from 1 to 10. A periodic two-dimensional array (such as a rectangular array) of interposers 900 may be formed over the first carrier substrate 310. Each interposer 900 may be formed within a unit area UA. The layer including all interposers 900 is herein referred to as an interposer layer. The interposer layer includes a two-dimensional array of interposers 900. In one embodiment, the two-dimensional array of interposers 900 may be a rectangular periodic two-dimensional array of interposers 900 having a first periodicity along a first horizontal direction hd1 and having a second periodicity along a second horizontal direction hd2 that is perpendicular to the first horizontal direction hd1.

At least one metallic material and a first solder material may be sequentially deposited over the front-side surface of the interposers 900. The at least one metallic material comprises a material that may be used for metallic bumps, such as copper. The thickness of the at least one metallic material may be in a range from 5 microns to 60 microns, such as from 10 microns to 30 microns, although lesser and greater thicknesses may also be used. The first solder material may comprise a solder material suitable for C2 bonding, i.e., for microbump bonding. The thickness of the first solder material may be in a range from 2 microns to 30 microns, such as from 4 microns to 15 microns, although lesser and greater thicknesses may also be used.

The first solder material and the at least one metallic material may be patterned into discrete arrays of first solder material portions 840 and arrays of metal bonding structures, which are herein referred to as arrays of on-interposer bump structure 938. Each array of on-interposer bump structure 938 may be formed within a respective unit area UA. Each array of first solder material portions 840 may be formed within a respective unit area UA. Each first solder material portion 840 may have a same horizontal cross-sectional shape as an underlying on-interposer bump structure 938.

In one embodiment, the on-interposer bump structure 938 may include, and/or may consist essentially of, copper or a copper-containing alloy. Other suitable materials are within the contemplated scope of disclosure. The thickness of the on-interposer bump structure 938 may be in a range from 5 microns to 60 microns, although lesser or greater thicknesses may also be used. The on-interposer bump structure 938 may have horizontal cross-sectional shapes of rectangles, rounded rectangles, circles, regular polygons, irregular polygons, or any other two-dimensional curvilinear shape having a closed periphery. In one embodiment, on-interposer bump structure 938 may be configured for microbump bonding (i.e., C2 bonding), and may have a thickness in a range from 10 microns to 30 microns, although lesser or greater thicknesses may also be used. In this embodiment, each array of on-interposer bump structure 938 may be formed as an array of microbumps (such as copper pillars) having a lateral dimension in a range from 10 microns to 25 microns, and having a pitch in a range from 20 microns to 50 microns.

Generally, at least one interposer 900 including a respective set of redistribution wiring interconnects 924 and redistribution insulating layers 922 may be provided. In one embodiment, the at least one interposer 900 may comprise a plurality of interposers 900 located over a first carrier wafer 310. Each interposer 900 comprises on-interposer bump structures 938 overlying a horizontal plane including a first horizontal surface of the interposer 900. The first horizontal surface is herein referred to as a die-side horizontal interposer surface 901. Each interposer 900 comprises a second horizontal surface that is located on an opposite side of the die-side horizontal interposer surface 901. The second horizontal surface is herein referred to as a substrate-side horizontal interposer surface 902. The vertical spacing between the die-side horizontal interposer surface 901 and the substrate-side horizontal interposer surface 902 is a thickness of the interposers 900.

Figure 5A:
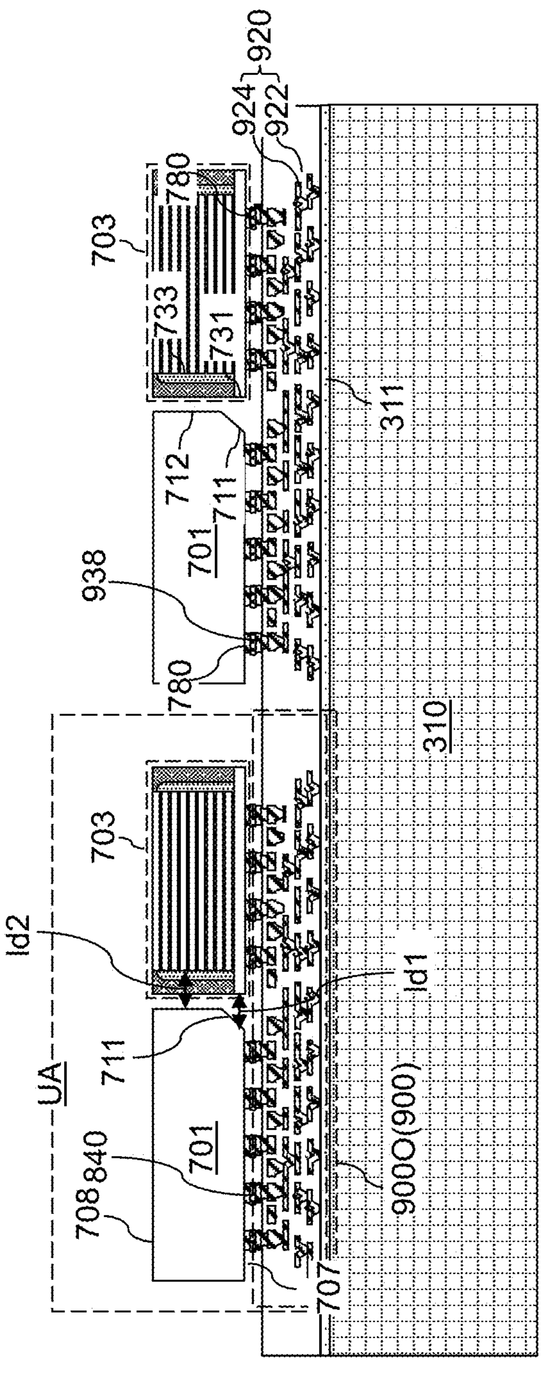
FIG. 5A is a vertical cross-sectional view of the first structure after attaching a semiconductor die and HBM dies to each interposer according to the first embodiment of the present disclosure.
Figure 5B:
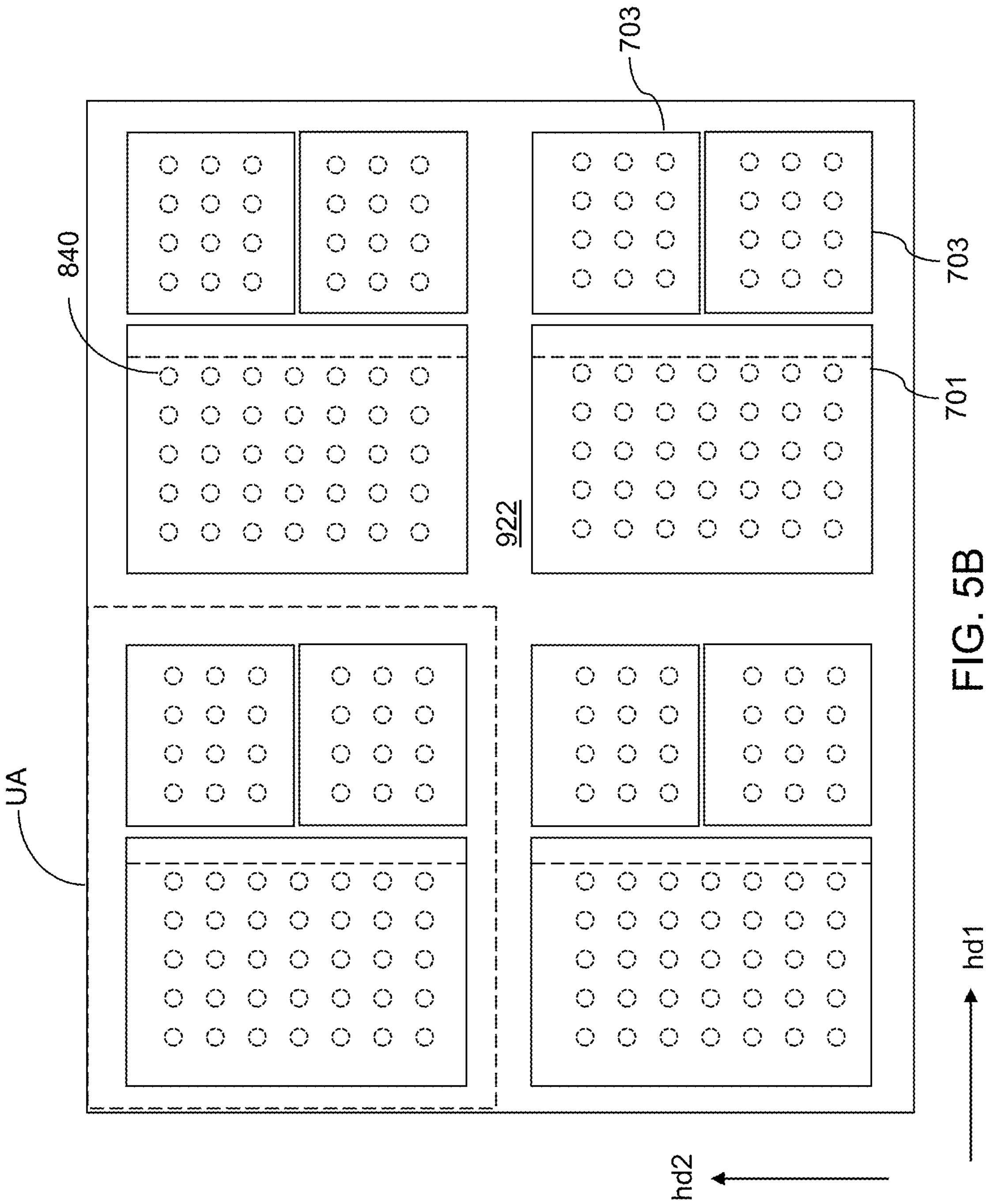
FIG. 5B is a top-down view of the first structure of FIG. 5A.

Referring to FIGS. 5A and 5B, a set of at least one semiconductor die 701 and at least one HBM die 703 (which may be a plurality of HBM dies 703) may be bonded to each interposer 900. In one embodiment, the interposers 900 may be arranged as a two-dimensional periodic array, and multiple sets of at least one semiconductor die 701 and at least one HBM die 703 may be bonded to the interposers 900 as a two-dimensional periodic rectangular array of sets of at least one semiconductor die 701 and at least one HBM die 703. In one embodiment, each set of at least one semiconductor die 701 and at least one HBM die 703 may comprise a plurality of semiconductor dies 701. For example, the at least one semiconductor die 701 may include at least one system-on-chip (SoC) die. Each SoC die may comprise an application processor die, a central processing unit die, or a graphic processing unit die.

Each semiconductor die 701 and each HBM die 703 may comprise a respective array of on-die bump structures 780. For example, each SoC die may comprise a respective array of on-die bump structures 780, and each HBM die 703 may comprise a respective array of on-die bump structures 780. Each of the semiconductor dies 701 and the HBM dies 703 may be positioned in a face-down position such that on-die bump structures 780 face the first solder material portions 840. Each set of at least one semiconductor die 701 and at least one HBM die 703 may be placed within a respective unit area UA. Placement of the semiconductor dies 701 and the HBM dies 703 may be performed using a pick and place apparatus such that each of the on-die bump structures 780 may be placed on a top surface of a respective one of the first solder material portions 840.

Generally, an interposer 900 including on-interposer bump structure 938 thereupon may be provided, and at least one semiconductor die 701 and at least one HBM die 703 including a respective set of on-die bump structures 780 may be provided. The at least one semiconductor die 701 and at least one HBM die 703 may be bonded to the interposer 900 using first solder material portions 840 that are bonded to a respective on-interposer bump structure 938 and to a respective one of the on-die bump structures 780.

Each set of at least one semiconductor die 701 and at least one HBM die 703 may be attached to a respective interposer 900 through a respective set of first solder material portions 840. The plan view is a view along a vertical direction, which is the direction that is perpendicular to the planar top surface of the interposer layer. Generally, at least one semiconductor die 701 as provided at the processing steps of FIGS. 2A-2C and at least one high bandwidth memory (HBM) die 703 of FIG. 3 may be attached to each interposer 900 such that each semiconductor die 701 and each HBM die 703 faces a die-side horizontal interposer surface 901 of the interposer 900, and such that each contoured sidewall (711, 712) of the at least one semiconductor die 701 faces a respective HBM die 703. As discussed above, each contoured sidewall (711, 712) of each semiconductor die 701 comprises a vertical sidewall segment 712 and a non-horizontal, non-vertical surface segment 711 that is adjoined to a bottom edge of the vertical sidewall segment 712 and is adjoined to an edge of the planar horizontal bottom surface 707 of the respective semiconductor die 701.

In one embodiment, a lateral distance ld1 between the non-horizontal, non-vertical surface segment 711 and the vertical HBM-die sidewall 731 of an adjacent HBM die 703 decreases with a vertical distance from the die-side horizontal interposer surface 901. In one embodiment, the non-horizontal, non-vertical surface segment 711 may comprise a beveled planar surface segment that is at a constant angle with respective to a horizontal plane including the planar horizontal bottom surface 707, the constant angle being in a range from 15 degrees to 75 degrees, or a convex surface segment having a convex profile in a vertical cross-sectional view and having a straight edge in a horizontal cross-sectional view. In one embodiment, a lateral distance ld1 between the vertical sidewall segment 712 and the vertical HBM-die sidewall 731 is in a range from 5% to 50% of a second lateral distance ld2 between the vertical sidewall segment 712 and most proximal sidewalls selected from sidewalls 733 of the plurality of random access memory dies 762. In one embodiment, a lateral spacing between the edge of the planar horizontal bottom surface 707 of the semiconductor die 701 and the vertical HBM-die sidewall 731 may be in a range from 50% to 200% of the lateral distance ld2 between the vertical sidewall segment 712 and the most proximal sidewalls selected from the sidewalls 733 of the plurality of random access memory dies 762.

Figure 6A:
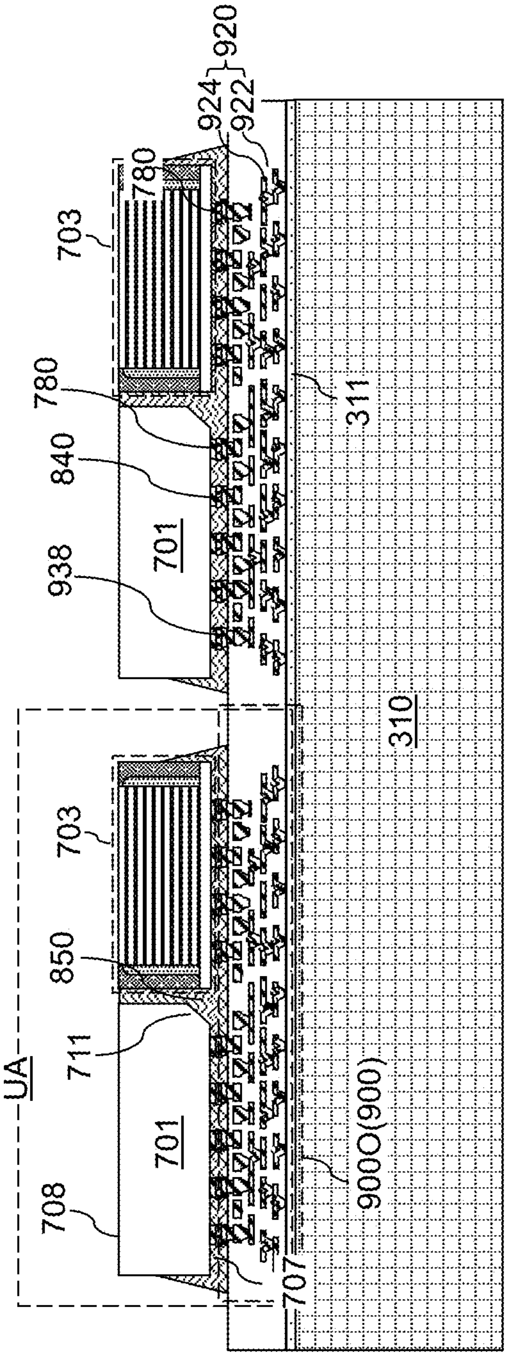
FIG. 6A is a vertical cross-sectional view of the first structure after formation of underfill material portions according to the first embodiment of the present disclosure.
Figure 6B:
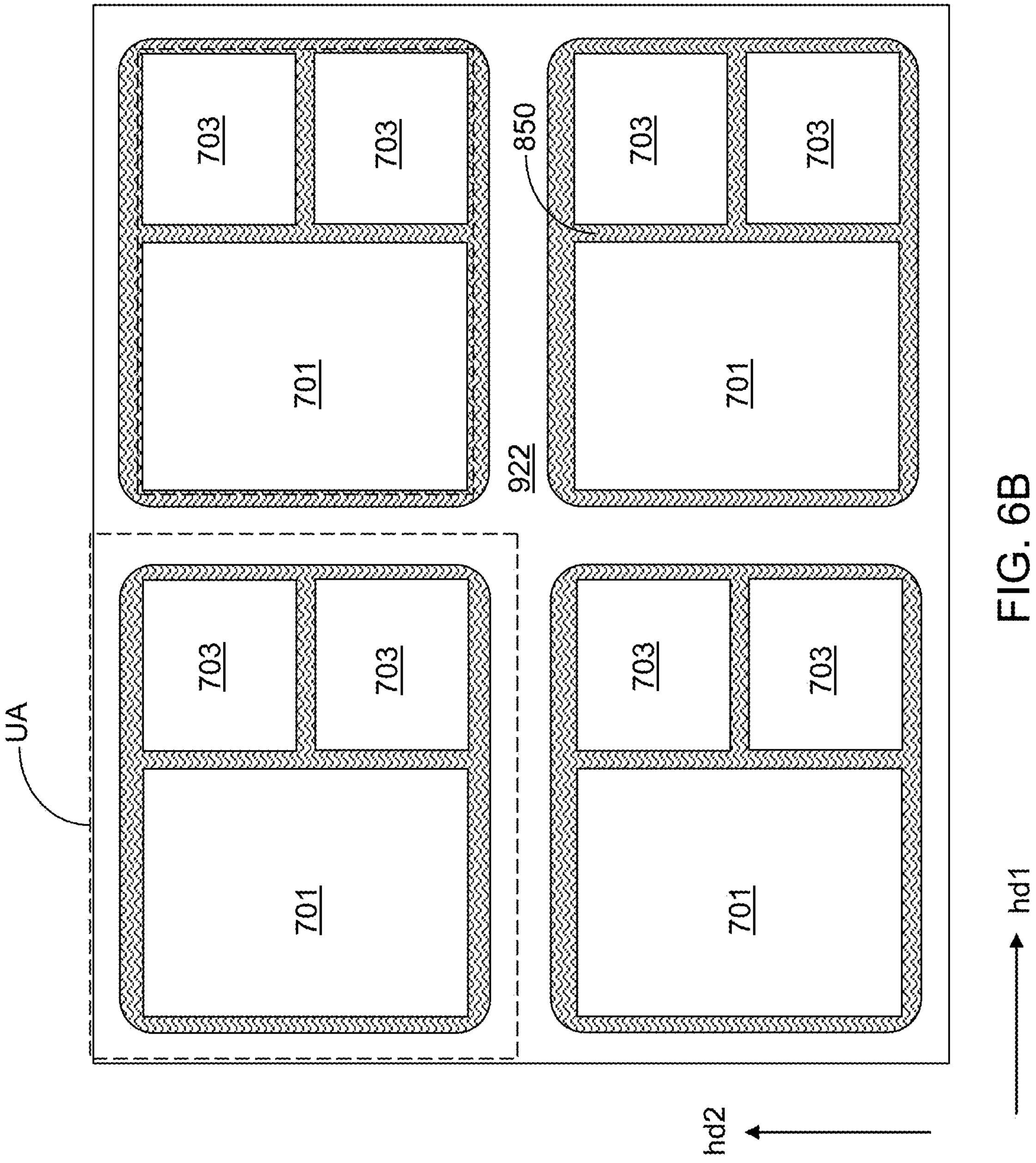
FIG. 6B is a top-down view of the region of the structure of FIG. 6A.

Referring to FIGS. 6A and 6B, a first underfill material may be applied into each gap between the interposers 900 and sets of at least one semiconductor die 701 and at least one HBM die 703 that are bonded to a respective interposer 900. The first underfill material may comprise any underfill material known in the art. Generally, the first underfill material may contain a filler material as known in the art. A first underfill material portion 850 may be formed within each unit area UA between an interposer 900 and an overlying set of at least one semiconductor die 701 and at least one HBM die 703. The first underfill material portions 850 may be formed by injecting the first underfill material around a respective array of first solder material portions 840 in a respective unit area UA. Any known underfill material application method may be used, which may be, for example, the capillary underfill method, the molded underfill method, or the printed underfill method.

Within each unit area UA, a first underfill material portion 850 may laterally surround, and contact, each of the first solder material portions 840 within the unit area UA. The first underfill material portion 850 may be formed around, and contact, the first solder material portions 840, the on-interposer bump structure 938, and the on-die bump structures 780 in the unit area UA. The first underfill material portion 850 is formed between semiconductor dies (701, 703) and an interposer 900, and thus, is also referred to as a die-interposer underfill material portion, or a DI underfill material portion.

Each interposer 900 in a unit area UA comprises on-interposer bump structure 938. At least one semiconductor die 701 and at least one HBM die 703 comprising a respective set of on-die bump structures 780 is attached to the on-interposer bump structure 938 through a respective set of first solder material portions 840 within each unit area UA. Within each unit area UA, a first underfill material portion 850 laterally surrounds the on-interposer bump structure 938 and the on-die bump structures 780 of the at least one semiconductor die 701 and at least one HBM die 703.

Generally, an underfill material portion 850 may be formed between each facing pair of the at least one interposer 900 and at least one set of the at least one semiconductor die 701 and at least one HBM die 703. In one embodiment, each interposer 900 comprises on-interposer bump structures 938 located above the horizontal plane including the die-side horizontal interposer surface 901 of the interposer 900, and the horizontally-extending portion of the underfill material portion 850 is located above the horizontal plane including the die-side horizontal interposer surface 901 of the interposer 900.

Each underfill material portion 850 consists essentially of at least one dielectric material, and as such, is a dielectric material portion. Each underfill material portion 850 may be applied directly on the vertical sidewall segment 712 and the non-horizontal, non-vertical surface segment 711 of at least one semiconductor die 701, and directly on sidewalls of at least one HBM die 703 within each unit area UA.

Figure 7A:
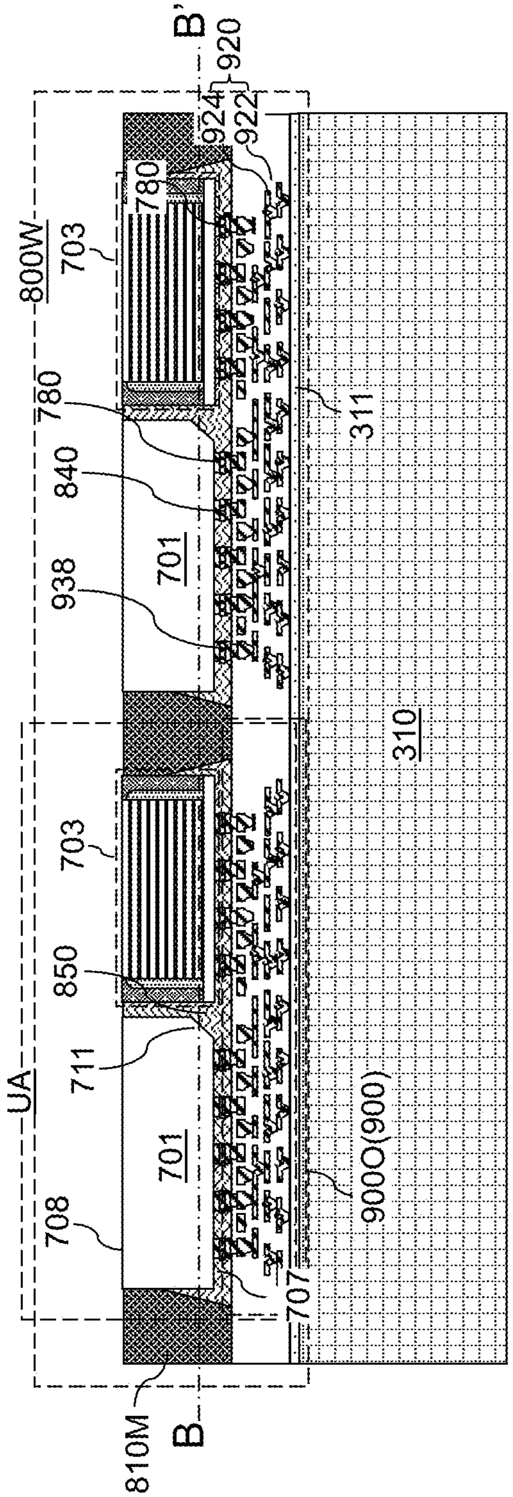
FIG. 7A is a vertical cross-sectional view of the first structure after formation of a molding compound matrix according to the first embodiment of the present disclosure.
Figure 7B:
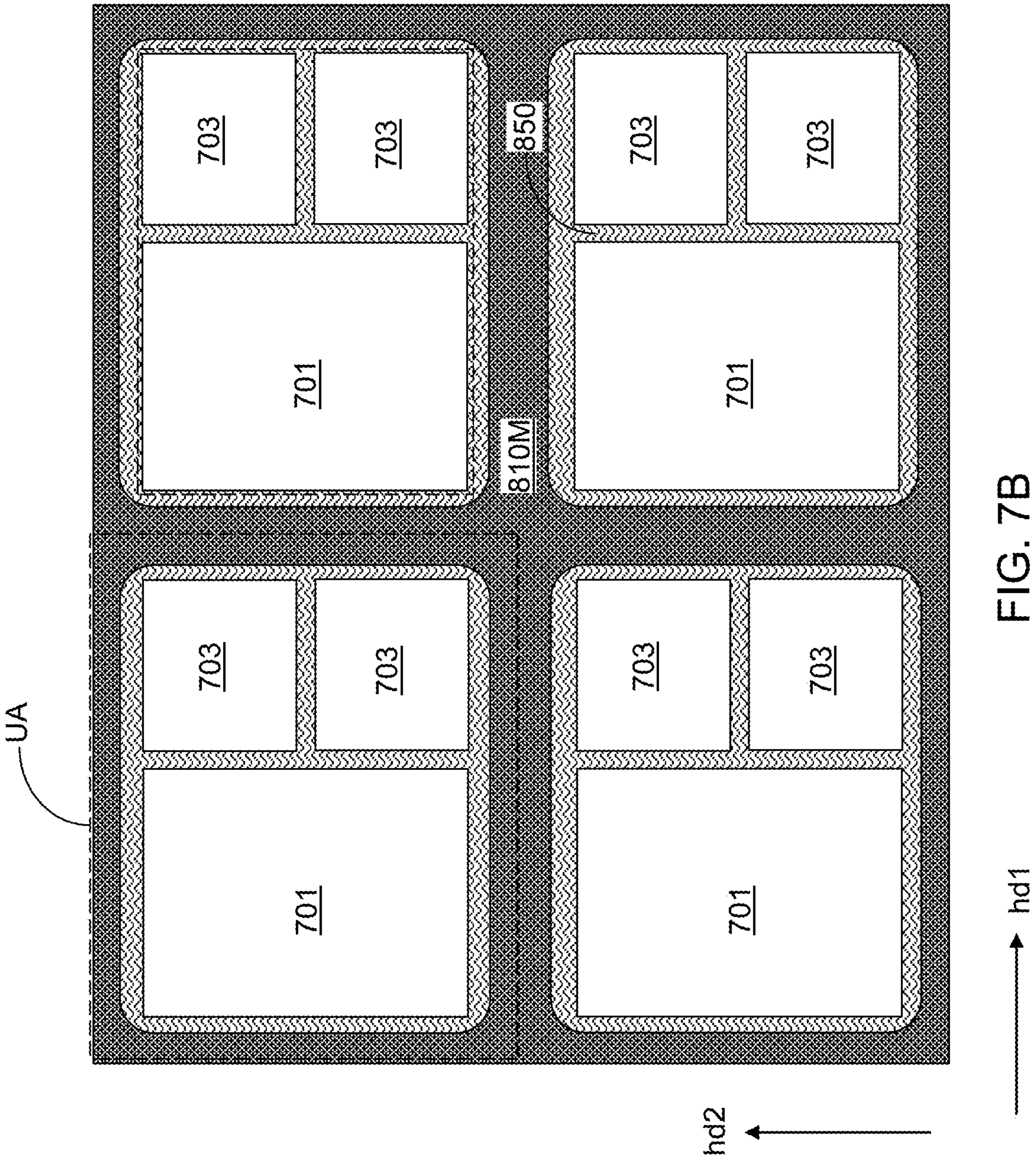
FIG. 7B is a horizontal cross-sectional view of the first structure along the horizontal plane B-B' of FIG. 7A.

Referring to FIGS. 7A and 7B, a molding compound (MC) may be applied to the gaps between contiguous assemblies of a respective set of at least one semiconductor die 701 and at least one HBM die 703 and a first underfill material portion 850. The MC may include an epoxy-containing compound that may be hardened (i.e., cured) to provide a dielectric material portion having sufficient stiffness and mechanical strength. The MC may include epoxy resin, hardener, silica (as a filler material), and other additives. The MC may be provided in a liquid form or in a solid form depending on the viscosity and flowability. Liquid MC provides better handling, good flowability, less voids, better fill, and less flow marks. Solid MC provides less cure shrinkage, better stand-off, and less die drift. A high filler content (such as 85% in weight) within an MC may shorten the time in mold, lower the mold shrinkage, and reduce the mold warpage. Uniform filler size distribution in the MC may reduce flow marks, and may enhance flowability. The curing temperature of the MC may be lower than the release (debonding) temperature of the first adhesive layer 311 in embodiments in which the adhesive layer includes a thermally debonding material. For example, the curing temperature of the MC may be in a range from 125° C. to 150° C.

The MC may be cured at a curing temperature to form an MC matrix 810M that laterally surrounds each assembly of a set of at least one semiconductor die 701 and at least one HBM die 703 and a first underfill material portion 850. The MC matrix 810M includes a plurality of molding compound (EMC) die frames that may be laterally adjoined to one another. Each MC die frame is a portion of the MC matrix 810M that is located within a respective unit area UA. Thus, each MC die frame laterally surrounds a respective a set of at least one semiconductor die 701 and at least one HBM die 703 and a respective first underfill material portion 850. Young's modulus of pure epoxy is about 3.35 GPa, and Young's modulus of the MC may be higher than Young's modulus of pure epoxy by adding additives. Young's modulus of MC may be greater than 3.5 GPa.

Portions of the MC matrix 810M that overlies the horizontal plane including the top surfaces of the semiconductor dies 701 and the HBM dies 703 may be removed by a planarization process. For example, the portions of the MC matrix 810M that overlies the horizontal plane may be removed using a chemical mechanical planarization (CMP). The combination of the remaining portion of the MC matrix 810M, the semiconductor dies 701 and the HBM dies 703, the first underfill material portions 850, and the two-dimensional array of interposers 900 comprises a reconstituted wafer 800W. Each portion of the MC matrix 810M located within a unit area UA constitutes an MC die frame. Each molding compound die frame laterally surrounds a respective underfill material portion 850, at least one respective semiconductor die 701, and at least one respective HBM die 703.

Figure 8:
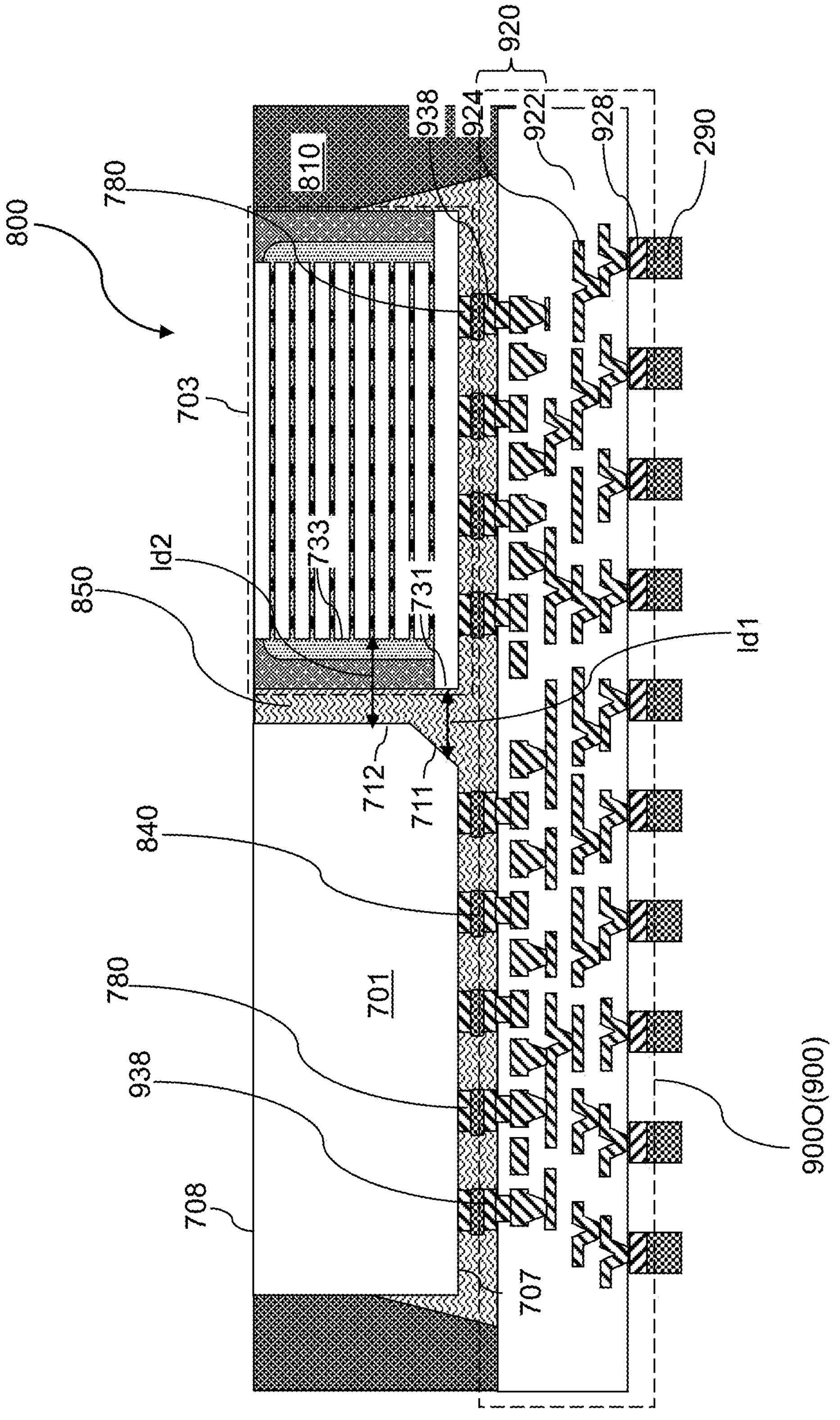
FIG. 8 is a vertical cross-sectional view of the first structure after attaching a second carrier substrate, detaching the first carrier substrate, forming fan-out bonding pads and second solder material portions, detaching the second carrier substrate, and dicing a reconstituted wafer into fan-out packages according to the first embodiment of the present disclosure.

Referring to FIG. 8, a second adhesive layer (not shown) may be applied to the physically exposed planar surface of the reconstituted wafer 800W, i.e., the physically exposed surfaces of the MC matrix 810M, the semiconductor dies 701 and the HBM dies 703, and the first underfill material portions 850. In one embodiment, the second adhesive layer may comprise a same material as, or may comprise a different material from, the material of the first adhesive layer 311. In embodiments in which the first adhesive layer 311 comprises a thermally decomposing adhesive material, the second adhesive layer may comprise another thermally decomposing adhesive material that decomposes at a higher temperature, or may comprise a light-to-heat conversion material.

A second carrier substrate (not shown) may be attached to the second adhesive layer. The second carrier substrate may be attached to the opposite side of the reconstituted wafer 800W relative to the first carrier substrate 310. Generally, the second carrier substrate may comprise any material that may be used for the first carrier substrate 310. The thickness of the second carrier substrate may be in a range from 500 microns to 2,000 microns, although lesser and greater thicknesses may also be used.

The first adhesive layer 311 may be decomposed by ultraviolet radiation or by a thermal anneal at a debonding temperature. In embodiments in which the first carrier substrate 310 includes an optically transparent material and the first adhesive layer 311 includes an LTHC layer, the first adhesive layer 311 may be decomposed by irradiating ultraviolet light through the transparent carrier substrate. The LTHC layer may be absorb the ultraviolet radiation and generate heat, which decomposes the material of the LTHC layer and cause the transparent first carrier substrate 310 to be detached from the reconstituted wafer 800W. In embodiments in which the first adhesive layer 311 includes a thermally decomposing adhesive material, a thermal anneal process at a debonding temperature may be performed to detach the first carrier substrate 310 from the reconstituted wafer 800W.

Fan-out bonding pads 928 and second solder material portions 290 may be formed by depositing and patterning a stack of at least one metallic material that may function as metallic bumps and a solder material layer. The metallic fill material for the fan-out bonding pads 928 may include copper. Other suitable metallic fill materials are within the contemplated scope of disclosure. The thickness of the fan-out bonding pads 928 may be in a range from 5 microns to 100 microns, although lesser or greater thicknesses may also be used. The fan-out bonding pads 928 and the second solder material portions 290 may have horizontal cross-sectional shapes of rectangles, rounded rectangles, or circles. Other suitable shapes are within the contemplated scope of disclosure. In embodiments in which the fan-out bonding pads 928 are formed as C4 (controlled collapse chip connection) pads, the thickness of the fan-out bonding pads 928 may be in a range from 5 microns to 50 microns, although lesser or greater thicknesses may also be used. In some embodiments, the fan-out bonding pads 928 may be, or include, under bump metallurgy (UBM) structures. The configurations of the fan-out bonding pads 928 are not limited to be fan-out structures. Alternatively, the fan-out bonding pads 928 may be configured for microbump bonding (i.e., C2 bonding), and may have a thickness in a range from 30 microns to 100 microns, although lesser or greater thicknesses may also be used. In such an embodiment, the fan-out bonding pads 928 may be formed as an array of microbumps (such as copper pillars) having a lateral dimension in a range from 10 microns to 300 microns, and having a pitch in a range from 10 microns to 500 microns.

The fan-out bonding pads 928 and the second solder material portions 290 may be formed on the opposite side of the MC matrix 810M and the two-dimensional array of sets of at least one semiconductor die 701 and at least one HBM die 703 relative to the interposer layer. The interposer layer includes a three-dimensional array of interposers 900. Each interposer 900 may be located within a respective unit area UA. Each interposer 900 may include redistribution dielectric layers 922, redistribution wiring interconnects 924 embedded in the redistribution dielectric layers 922, and fan-out bonding pads 928. The fan-out bonding pads 928 may be located on an opposite side of the on-interposer bump structure 938 relative to the redistribution dielectric layers 922, and may be electrically connected to a respective one of the on-interposer bump structure 938.

The second adhesive layer may be decomposed by ultraviolet radiation or by a thermal anneal at a debonding temperature. In embodiments in which the second carrier substrate includes an optically transparent material and the second adhesive layer includes an LTHC layer, the second adhesive layer may be decomposed by irradiating ultraviolet light through the transparent carrier substrate. In embodiments in which the second adhesive layer includes a thermally decomposing adhesive material, a thermal anneal process at a debonding temperature may be performed to detach the second carrier substrate from the reconstituted wafer 800W.

The reconstituted wafer 800W including the fan-out bonding pads 928 may be subsequently diced along dicing channels by performing a dicing process. The dicing channels correspond to the boundaries between neighboring pairs of die areas DA. Each diced unit from the reconstituted wafer 800W may include a fan-out package 800. In other words, each diced portion of the assembly of the two-dimensional array of sets of at least one semiconductor die 701 and at least one HBM die 703, the two-dimensional array of first underfill material portions 850, the MC matrix 810M, and the two-dimensional array of interposers 900 constitutes a fan-out package 800. Each diced portion of the MC matrix 810M constitutes a molding compound die frame 810. Each diced portion of the interposer layer (which includes the two-dimensional array of interposers 900) constitutes an interposer 900, which may be an organic interposer 9000.

Each fan-out package 800 comprises an interposer 900 including on-interposer bump structure 938, at least one semiconductor die 701 and at least one HBM die 703 comprising a respective set of on-die bump structures 780 that is attached to the on-interposer bump structure 938 through a respective set of first solder material portions 840, a first underfill material portion 850 laterally surrounding the on-interposer bump structure 938 and the on-die bump structures 780 of the at least one semiconductor die 701 and at least one HBM die 703.

The fan-out package 800 may comprise a molding compound die frame 810 laterally surrounding the at least one semiconductor die 701 and at least one HBM die 703 and comprising a molding compound material. In one embodiment, the molding compound die frame 810 may include sidewalls that are vertically coincident with sidewalls of the interposer 900, i.e., located within same vertical planes as the sidewalls of the interposer 900. Generally, the molding compound die frame 810 may be formed around the at least one semiconductor die 701 and at least one HBM die 703 after formation of the first underfill material portion 850 within each fan-out package 800. The molding compound material contacts a peripheral portion of a planar surface of the interposer 900. Each fan-out package 800 comprises a bonded assembly of an interposer 900, at least one semiconductor die 701, and at least one HBM die 703.

In one embodiment, a first lateral spacing ld1 between the non-vertical surface segment 711 and the vertical HBM-die sidewall 731 is in a range from 5% to 50% of a second lateral distance ld2 between the vertical sidewall segment 712 and most proximal sidewalls selected from sidewalls 733 of the plurality of random access memory dies 762; and a lateral spacing between the edge of the planar horizontal bottom surface 707 of the semiconductor die 701 and the vertical HBM-die sidewall 731 is in a range from 50% to 200% of the lateral distance between the vertical sidewall segment 712 and the most proximal sidewalls selected from sidewalls of the plurality of random access memory dies 762.

Figure 9:
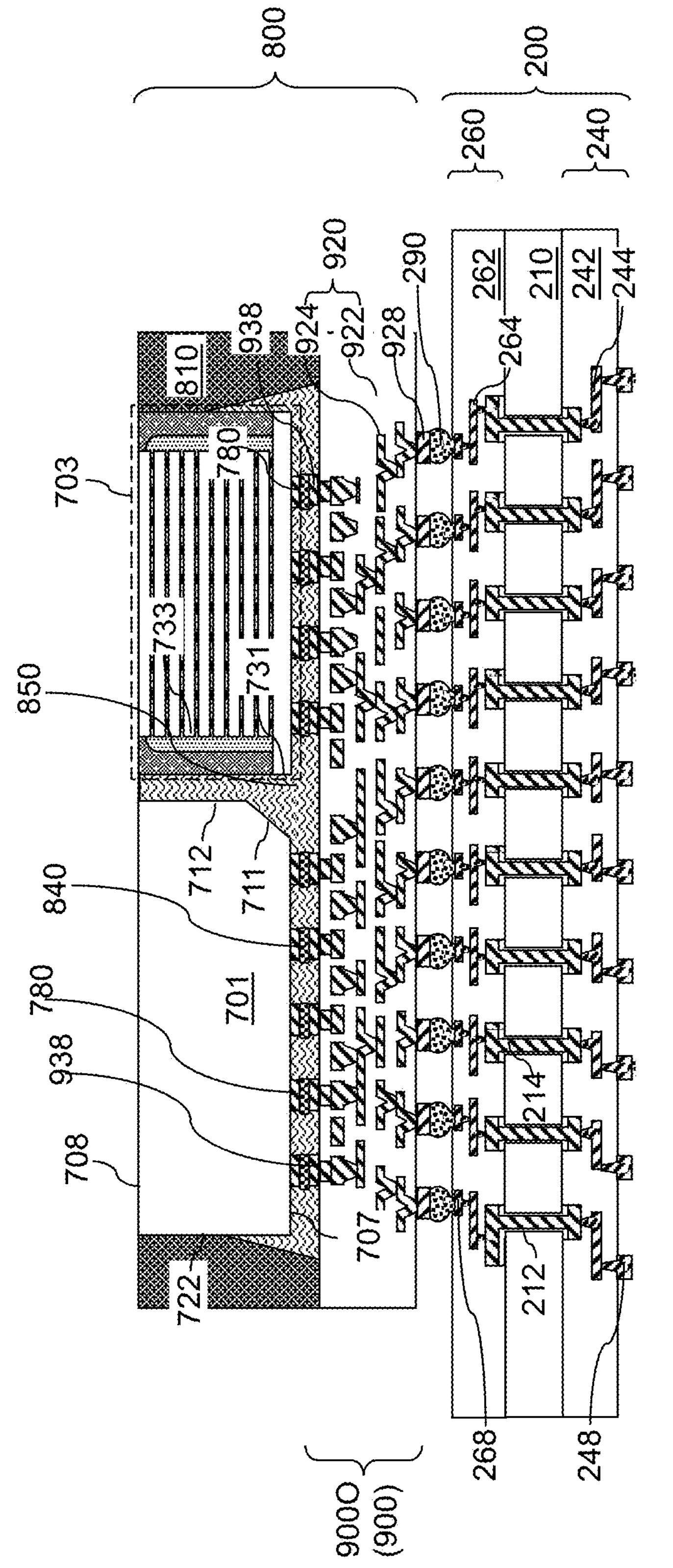
FIG. 9 is a vertical cross-sectional view of the first structure after attaching the fan-out package to a packaging substrate according to the first embodiment of the present disclosure.

Referring to FIG. 9, a packaging substrate 200 is provided. The packaging substrate 200 may be a cored packaging substrate including a core substrate 210, or a coreless packaging substrate that does not include a package core. Alternatively, the packaging substrate 200 may include a system-on-integrated packaging substrate (SoIS) including redistribution layers and/or dielectric interlayers, at least one embedded interposer (such as a silicon interposer). Such a system-integrated packaging substrate may include layer-to-layer interconnections using solder material portions, microbumps, underfill material portions (such as molded underfill material portions), and/or an adhesion film. While the present disclosure is described using a substrate package, it is understood that the scope of the present disclosure is not limited by any particular type of substrate package and may include an SoIS. The core substrate 210 may include a glass epoxy plate including an array of through-plate holes. An array of through-core via structures 214 including a metallic material may be provided in the through-plate holes. Each through-core via structure 214 may, or may not, include a cylindrical hollow therein. Optionally, dielectric liners 212 may be used to electrically isolate the through-core via structures 214 from the core substrate 210.

The packaging substrate 200 may include board-side surface laminar circuit (SLC) 240 and a chip-side surface laminar circuit (SLC) 260. The board-side SLC may include board-side insulating layers 242 embedding board-side wiring interconnects 244. The chip-side SLC 260 may include chip-side insulating layers 262 embedding chip-side wiring interconnects 264. The board-side insulating layers 242 and the chip-side insulating layers 262 may include a photosensitive epoxy material that may be lithographically patterned and subsequently cured. The board-side wiring interconnects 244 and the chip-side wiring interconnects 264 may include copper that may be deposited by electroplating within patterns in the board-side insulating layers 242 or the chip-side insulating layers 262.

In one embodiment, the packaging substrate 200 includes a chip-side surface laminar circuit 260 comprising chip-side wiring interconnects 264 connected to an array of chip-side bonding pads 268 that may be bonded to the array of second solder material portions 290, and a board-side surface laminar circuit 240 including board-side wiring interconnects 244 connected to an array of board-side bonding pads 248. The array of board-side bonding pads 248 is configured to allow bonding through solder balls. The array of chip-side bonding pads 268 may be configured to allow bonding through C4 solder balls. Generally, any type of packaging substrate 200 may be used. While the present disclosure is described using an embodiment in which the packaging substrate 200 includes a chip-side surface laminar circuit 260 and a board-side surface laminar circuit 240, embodiments are expressly contemplated herein in which one of the chip-side surface laminar circuit 260 and the board-side surface laminar circuit 240 is omitted, or is replaced with an array of bonding structures such as microbumps. In an illustrative example, the chip-side surface laminar circuit 260 may be replaced with an array of microbumps or any other array of bonding structures.

The fan-out package 800 may be disposed over the packaging substrate 200 with an array of the second solder material portions 290 therebetween. In embodiments in which the second solder material portions 290 are formed on the fan-out bonding pads 928 of the fan-out package 800, the second solder material portions 290 may be disposed on the chip-side bonding pads 268 of the packaging substrate 200. A reflow process may be performed to reflow the second solder material portions 290, thereby inducing bonding between the fan-out package 800 and the packaging substrate 200. Each second solder material portion 290 may be bonded to a respective one of the fan-out bonding pads 928 and to a respective one of the chip-side bonding pads 268. In one embodiment, the second solder material portions 290 may include C4 solder balls, and the fan-out package 800 may be attached to the packaging substrate 200 through an array of C4 solder balls. Generally, the fan-out package 800 may be bonded to the packaging substrate 200 such that the interposer 900 is bonded to the packaging substrate 200 by an array of solder material portions (such as the second solder material portions 290).

Figure 10:
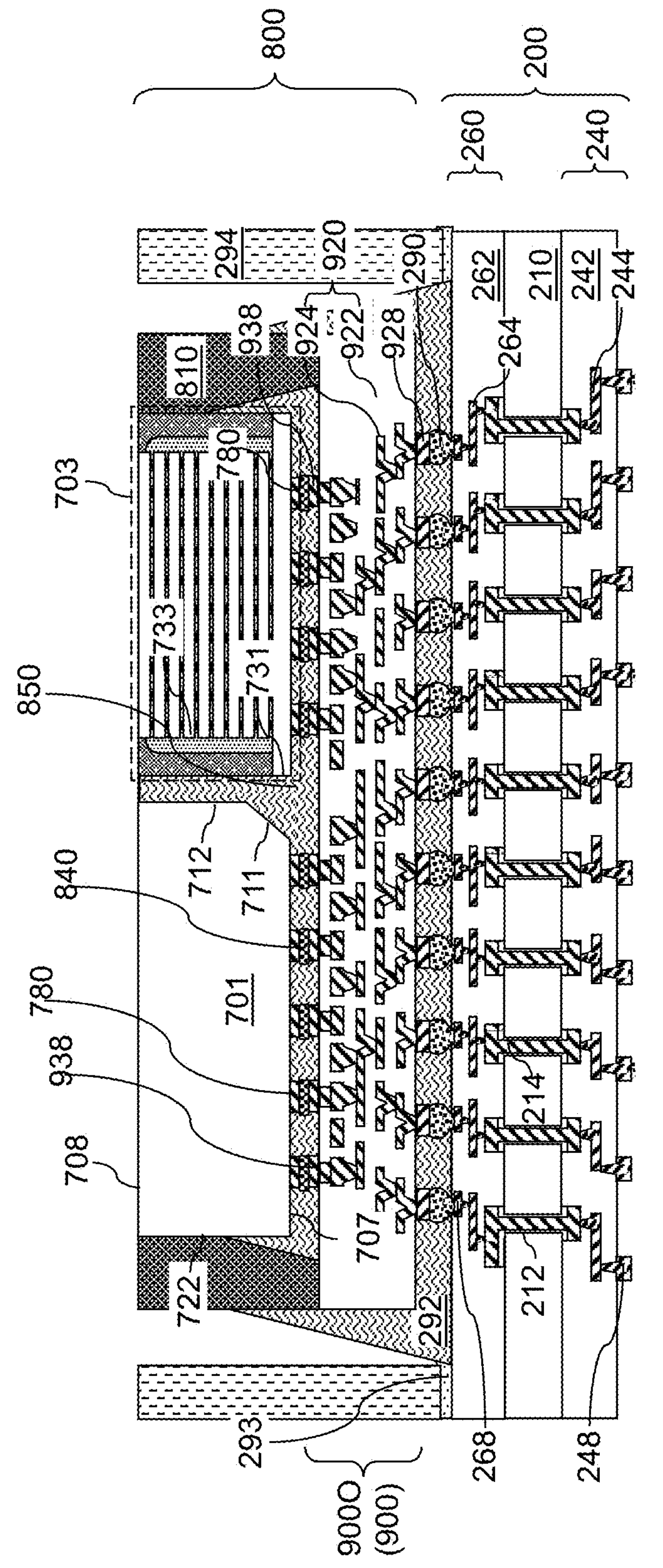
FIG. 10 is a vertical cross-sectional view of the first structure after formation of a second underfill material portion and attaching a stiffener structure according to the first embodiment of the present disclosure.

Referring to FIG. 10, a second underfill material portion 292 may be formed around the second solder material portions 290 by applying and shaping a second underfill material. The second underfill material portion 292 may be formed by injecting the second underfill material around the array of second solder material portions 290 after the second solder material portions 290 are reflowed. Any known underfill material application method may be used, which may be, for example, the capillary underfill method, the molded underfill method, or the printed underfill method. The second underfill material may the same or different from the first underfill material.

The second underfill material portion 292 may be formed between the interposer 900 and the packaging substrate 200. The second underfill material portion 292 may contact each of the second solder material portions 290 (which may be C4 solder balls or C2 solder caps), and may contact vertical sidewalls of the fan-out package 800. The second underfill material portion laterally surrounds, and contacts, the array of second solder material portions 290 and the fan-out package 800.

Optionally, a stabilization structure 294, such as a cap structure or a ring structure, may be attached to the assembly of the fan-out package 800 and the packaging substrate 200 to reduce deformation of the assembly during subsequent processing steps and/or during usage of the assembly. The stabilization structure 294 may comprise a stiffener structure, and may be attached to the packaging substrate 200 using an adhesive layer 293.

In one embodiment, the fan-out package 800 comprises a molding compound die frame 810 that laterally surrounds the at least one semiconductor die 701 and at least one HBM die 703 and contacting a peripheral portion of a top surface of the interposer 900. The second underfill material portion 292 may be formed directly on sidewalls of the molding compound die frame 810.

Figure 11:
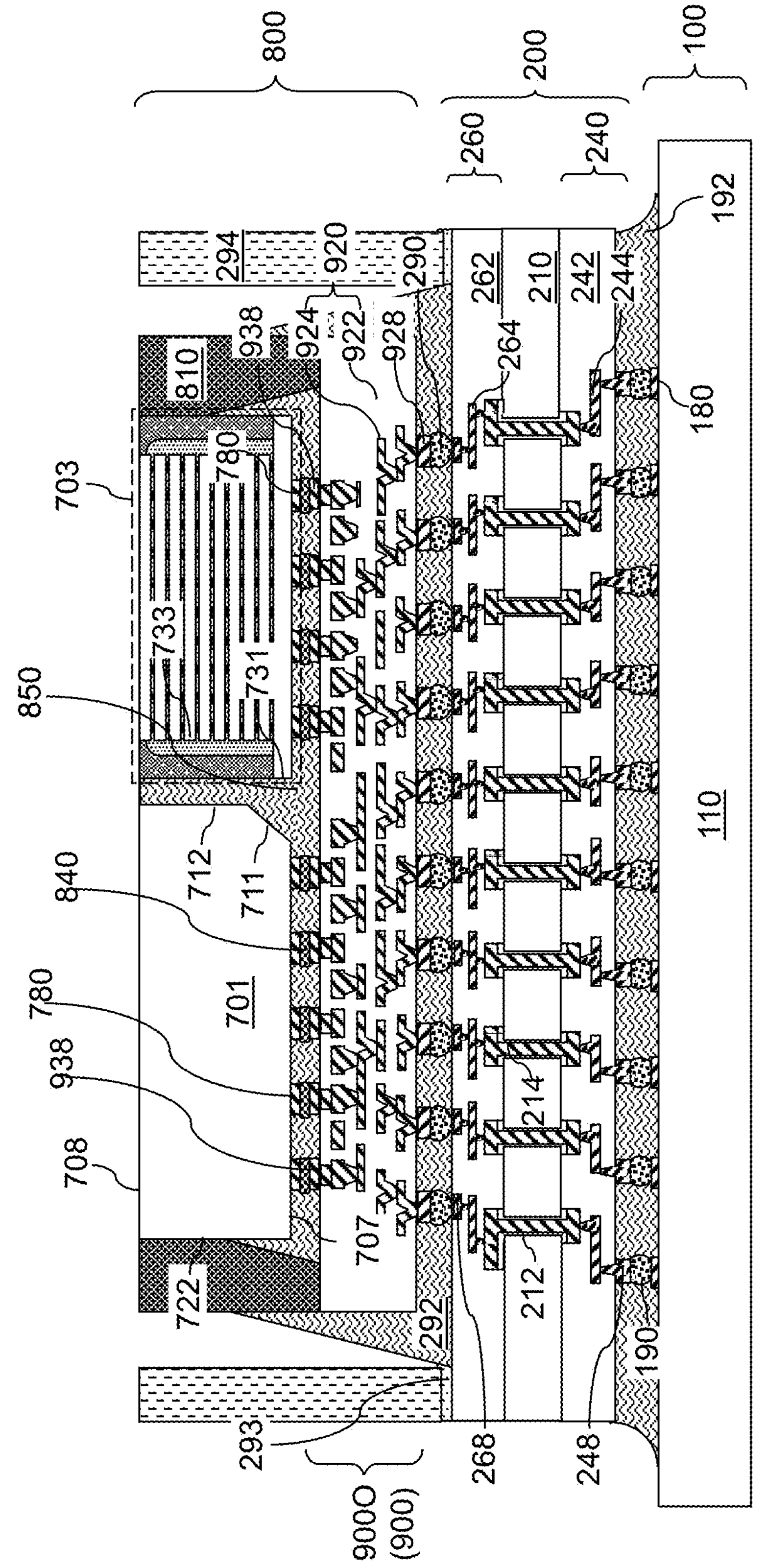
FIG. 11 is a vertical cross-sectional view of the first structure after the packaging substrate is attached to a printed circuit board (PCB) according to the first embodiment of the present disclosure.

Referring to FIG. 11, a printed circuit board (PCB) 100 including a PCB substrate 110 and PCB bonding pads 180 may be provided. The PCB 100 includes a printed circuitry (not shown) at least on one side of the PCB substrate 110. An array of solder joints 190 may be formed to bond the array of board-side bonding pads 248 to the array of PCB bonding pads 180. The solder joints 190 may be formed by disposing an array of solder balls between the array of board-side bonding pads 248 and the array of PCB bonding pads 180, and by reflowing the array of solder balls. A third underfill material portion 192 may be formed around the solder joints 190 by applying and shaping a third underfill material. The packaging substrate 200 is attached to the PCB 100 through the array of solder joints 190. The third underfill material 192 may be the same as or different from the second underfill material 292. The third underfill material 192 may be the same as or different from the first underfill material 850.

Figure 12A:
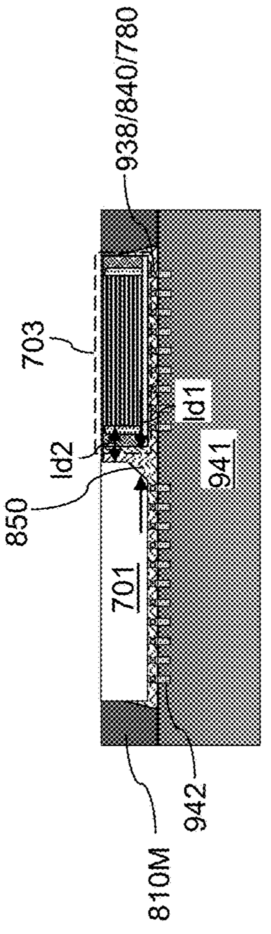
FIGS. 12A-12C are sequential vertical cross-sectional views of a second structure according to a second embodiment of the present disclosure.
Figure 12B:
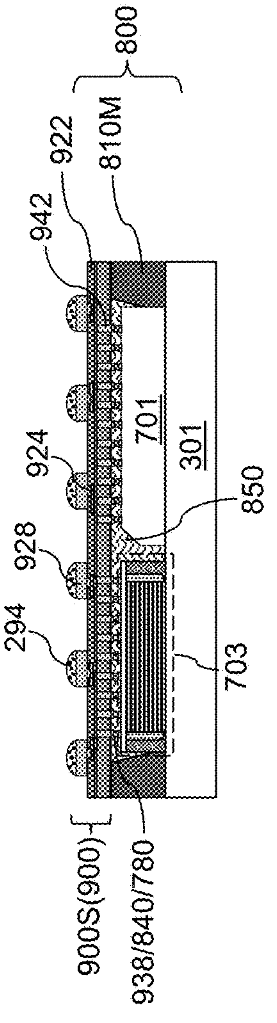
Figure 12C:
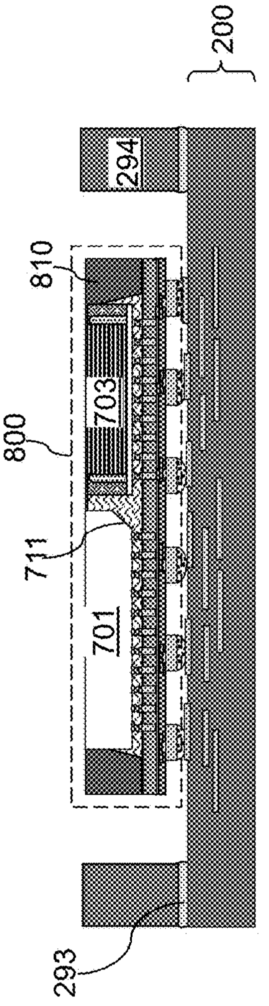

FIGS. 12A-12C are sequential vertical cross-sectional views of a second structure according to a second embodiment of the present disclosure.

Referring to FIG. 12A, a semiconductor substrate 941 may be provided, which may be any semiconductor substrate known in the art. For example, the semiconductor substrate 941 may comprise a commercially available single crystalline silicon wafer. Trenches may be formed in an upper portion of the semiconductor substrate 941, and may be filled with a conformal dielectric material layer (not shown) and a conductive fill material such as copper, gold, nickel, etc. Excess portions of the conductive fill material and the conformal dielectric material layer may be removed from above the horizontal plane including the top surface of the semiconductor substrate 941 by performing a planarization process such as a chemical mechanical polishing (CMP) process. Through-substrate connection structures 942 may be formed, which includes a through-substrate via (TSV) structure and a dielectric spacer that electrically isolates the TSV structure from the semiconductor substrate 941. On-interposer bump structure 938 and first solder material portions 840 may be formed on top of the through-substrate connection structures 942.

Subsequently, the processing steps of FIGS. 5A and 5B may be performed to attach at least one semiconductor die 701 of FIGS. 2A-2C and at least one HBM die of FIG. 3 to the semiconductor substrate 941. In this embodiment, the combination of the semiconductor substrate 941, the through-substrate connection structures 942, and the on-interposer bump structures 938 function as a mating structure, which comprises a two-dimensional array of in-process interposers that is subsequently modified into a two-dimensional array of interposers. As used herein, an "in-process structure" refers to a structure that is modified during a subsequently processing step. Arrays of solder material portions 840 may be used to attach at least one semiconductor die 701 and at least one HBM die 703 to the mating structure. Generally, the geometry between each neighboring pair of a semiconductor die 701 and an HBM die 703 may be the same as described above with reference to the first structure.

The processing steps of FIGS. 6A and 6B may be performed to form an underfill material portion 850 around each array of solder material portions 840. Subsequently, the processing steps of FIGS. 7A and 7B may be performed to form a molding compound matrix 810M. A reconstituted wafer is formed, which includes the semiconductor substrate 941 and a two-dimensional array of combinations of at least one semiconductor die 701, at least one HBM die 703, and an underfill material portion 850.

Referring to FIG. 12B, a carrier substrate 301 may be attached to a reconstituted wafer including a two-dimensional array of combinations of at least one semiconductor die 701, at least one HBM die 703, and an underfill material portion 850. The carrier substrate 301 may be attached to the planar horizontal top surfaces of the semiconductor dies 701. The semiconductor substrate 941 may be thinned from the backside, for example, by grinding, polishing, at least one isotropic etch process, and/or at least one anisotropic etch process. The semiconductor substrate 941 may be thinned until surfaces of TSV structures in the through-substrate connection structures 942 are physically exposed. Redistribution dielectric layers 922 and redistribution wiring interconnects 924 may be formed on the backside of the thinned semiconductor substrate 941 such that the redistribution wiring interconnects 924 are electrically connected to the TSV structures within the through-substrate connection structures 942. Subsequently, fan-out bonding pads 928 and second solder material portions 294 may be formed on the backside of the redistribution dielectric layers 922 and the redistribution wiring interconnects 924.

The reconstituted wafer comprises the thinned semiconductor substrate 941, the through-substrate connection structures 942, the redistribution dielectric layers 922, the redistribution wiring interconnects 924, the fan-out bonding pads 928, the on-interposer bump structures 938, the semiconductor dies 701, the HBM dies 703, the underfill material portions 850, and the molding compound matrix 810M. Each portion of the combination of the thinned semiconductor substrate 941, the through-substrate connection structures 942, the redistribution dielectric layers 922, the redistribution wiring interconnects 924, the fan-out bonding pads 928, the on-interposer bump structures 938 that is located within a respective unit area constitutes a silicon interposer 900S, which is an interposer 900 and functions in the same manner as an organic interposer 9000 described above. Each contiguous combination including a silicon interposer 900S, at least one semiconductor die 701, at least one HBM die 703, an underfill material portion 850, and a molding compound die frame (which is a portion of a molding compound matrix 810M) located within a respective unit area constitutes a fan-out package 800.

Referring to FIG. 12C, the carrier substrate 301 may be detached from the reconstituted wafer, and the reconstituted wafer may be diced into interposers 800. The processing steps described with reference to FIGS. 9-11 may be performed to attach the interposer 800 to a packaging substrate 200, and then to attach the packaging substrate 200 to a printed circuit board 100. Additional optional structures such as a stiffener ring 294 may be adhered using an adhesive 293 to the packaging substrate 200.

Figure 13A:
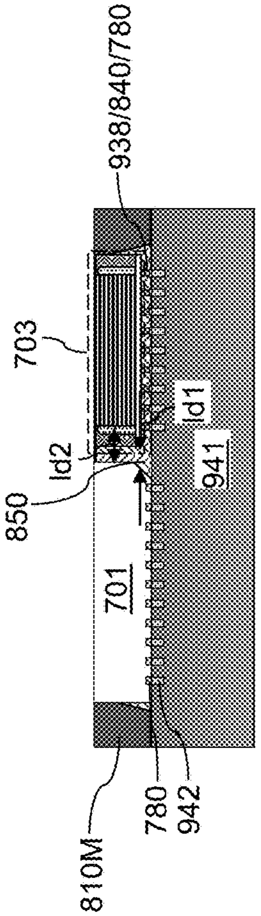
FIGS. 13A-13C are sequential vertical cross-sectional views of a third structure according to a third embodiment of the present disclosure.
Figure 13B:
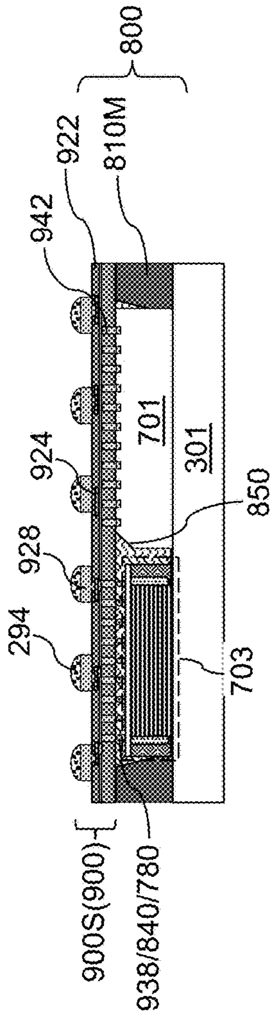
Figure 13C:
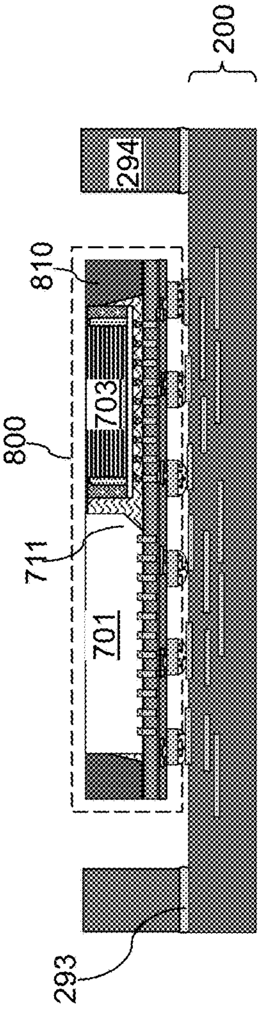

FIGS. 13A-13C are sequential vertical cross-sectional views of a third structure according to a third embodiment of the present disclosure.

Referring to FIG. 13A, the third structure may be derived from the second structure illustrated in FIG. 12A by attaching the at least one semiconductor die 701 to the mating structure including the combination of the semiconductor substrate 941 and the through-substrate connection structures 942 via metal-to-metal bonding (such as copper-to-copper bonding). In one embodiment, a silicon oxide layer (not expressly shown) may be provided on a front side of the semiconductor substrate 941 that faces the at least one semiconductor die 701, and another silicon oxide layer (not expressly shown) may be provide on a side of each semiconductor die 701 that faces the semiconductor substrate 941. In this embodiment, a combination of metal-to-metal bonding and dielectric-to-dielectric bonding (between the two silicon oxide layers) may be used. In one embodiment, front end surfaces of the TSV structures of the through-substrate connection structures 942 may be used as metallic bonding structures that provide metal-to-metal bonding with the on-die bump structures 780 that are embedded within each semiconductor die 701.

Generally, each semiconductor die 701 may be attached to the mating structure (which comprises an in-process interposer) through metal-to-metal bonding and/or hybrid bonding (which includes metal-to-metal bonding and dielectric-to-dielectric bonding). In one embodiment, a planar horizontal bottom surface 707 may directly contact a front surface of the semiconductor substrate 941, which functions as a die-side horizontal interposer surface of interposers to be subsequently formed. Subsequently, an underfill material portion 850 may be formed around the at least one semiconductor die 701 and the at least one HBM die 703 within each unit area. A molding compound matrix 810M may be formed around the two-dimensional array of combinations of at least one semiconductor die 701, at least one HBM die 703, and an underfill material portion 850. A reconstituted wafer may be thus provided.

Referring to FIG. 13B, the processing steps described with reference to FIG. 12B may be performed to form a two-dimensional array of silicon interposers 900S. Each contiguous combination including a silicon interposer 900S, at least one semiconductor die 701, at least one HBM die 703, an underfill material portion 850, and a molding compound die frame (which is a portion of a molding compound die frame 810M) located within a respective unit area constitutes a fan-out package 800.

Referring to FIG. 13C, the carrier substrate 301 may be detached from the reconstituted wafer, and the reconstituted wafer may be diced into interposers 800. The processing steps described with reference to FIGS. 9-11 may be performed to attach the interposer 800 to a packaging substrate 200, and then to attach the packaging substrate 200 to a printed circuit board 100. Additional optional structures such as a stiffener ring 294 may be adhered using an adhesive 293 to the packaging substrate 200.

FIGS. 14A-14E are sequential vertical cross-sectional views of a fourth structure according to a fourth embodiment of the present disclosure.

Figure 14A:
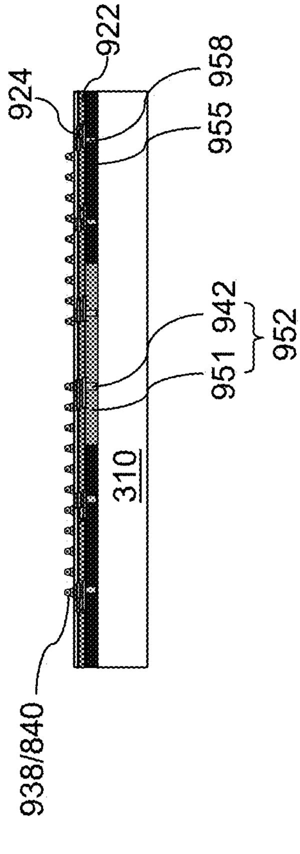
FIGS. 14A-14E are sequential vertical cross-sectional views of a fourth structure according to a fourth embodiment of the present disclosure.

Referring to FIG. 14A, the fourth structure may be formed by providing a first carrier substrate 310, which may be, for example, a glass substrate. An array of local silicon interconnects (LSI's) 952 may be placed over the carrier substrate 310. Each LSI 952 may comprise a silicon substrate 951 and a plurality of through-substrate connection structures 942. Each through-substrate connection structure 942 may comprise a respective through-substrate via structure and a respective insulating spacer that laterally surrounds the respective through-substrate via structure. A dielectric matrix layer 955 may be formed around the two-dimensional array of LSI's 952, and through-integrated-fan-out-via structures 958 may be formed through the polymeric matrix layer 955. The through-integrated-fan-out-via structures 958 are also referred to through-InFO-via structures 958 or TIV structures 958.

Redistribution dielectric layers 922 and redistribution wiring interconnects 924 may be formed on the top surfaces of the LSI's 952 and the dielectric matrix layer 955 such that the redistribution wiring interconnects 924 are electrically connected to the TSV structures within the through-substrate connection structures 942 and/or to the TIV structures 958. At least one metallic material and a first solder material may be sequentially deposited over the redistribution dielectric layer 922 and the redistribution wiring interconnects 924, and may be subsequently patterned to form an array of on-interposer bump structures 938 and an array of first solder material portions 840. For example, the processing steps described with reference to FIGS. 4A and 4B may be used to form the array of on-interposer bump structures 938 and the array of first solder material portions 840.

Figure 14B:
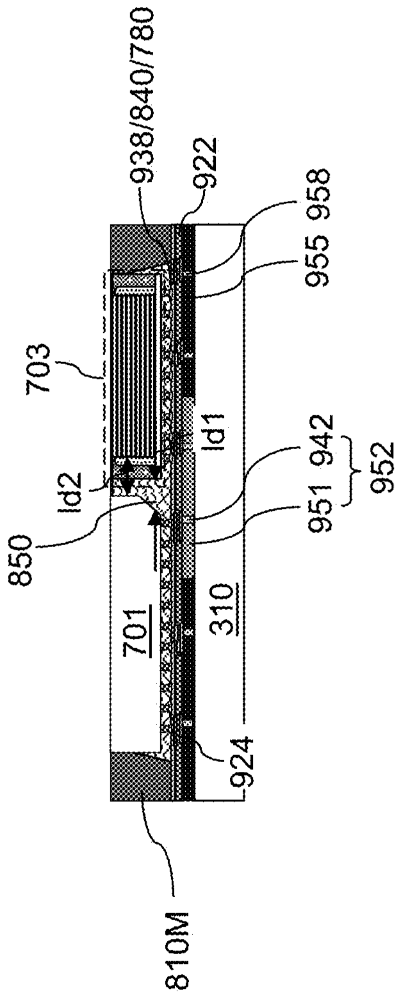

Referring to FIG. 14B, the processing steps of FIGS. 5A and 5B may be performed to attach at least one semiconductor die 701 of FIGS. 2A-2C and at least one HBM die of FIG. 3 to the semiconductor substrate 941. In this embodiment, the combination of the LSI's 952, the dielectric matrix layer 955, the TIV structures 958, the redistribution dielectric layers 922, the redistribution wiring interconnects 924, and the on-interposer bump structures 938 function as a mating structure, which comprises a two-dimensional array of in-process interposers that is subsequently modified into a two-dimensional array of interposers. Arrays of solder material portions 840 may be used to attach at least one semiconductor die 701 and at least one HBM die 703 to the mating structure. Generally, the geometry between each neighboring pair of a semiconductor die 701 and an HBM die 703 may be the same as described above with reference to the first structure.

The processing steps of FIGS. 6A and 6B may be performed to form an underfill material portion 850 around each array of solder material portions 840. Subsequently, the processing steps of FIGS. 7A and 7B may be performed to form a molding compound matrix 810M. A reconstituted wafer is formed over the first carrier substrate 311.

Figure 14C:
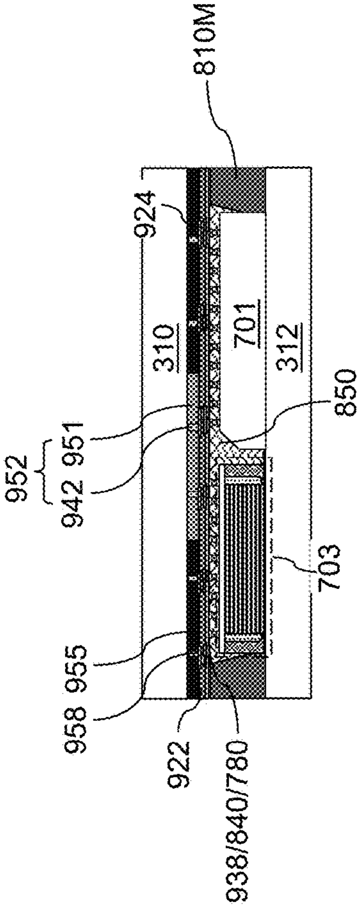

Referring to FIG. 14C, a second carrier substrate 312 may be attached to a reconstituted wafer including a two-dimensional array of combinations of at least one semiconductor die 701, at least one HBM die 703, and an underfill material portion 850. The second carrier substrate 312 may be attached to the planar horizontal top surfaces of the semiconductor dies 701.

Figure 14D:
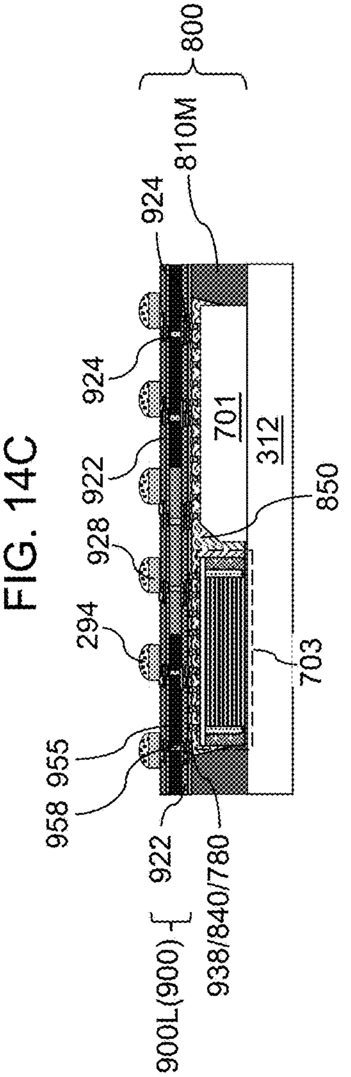

Referring to FIG. 14D, the first carrier substrate 311 may be detached from the reconstituted wafer. Additional redistribution dielectric layers 922 and additional redistribution wiring interconnects 924 may be formed on the backside of the two-dimensional array of LSI's 952, the dielectric matrix layer 955, and the TIV structures 958 such that the additional redistribution wiring interconnects 924 are electrically connected to a respective one of the TSV structures within the through-substrate connection structures 942 and/or the TIV structures 958. Subsequently, fan-out bonding pads 928 and second solder material portions 294 may be formed on the backside of the additional redistribution dielectric layers 922 and the additional redistribution wiring interconnects 924.

The reconstituted wafer comprises semiconductor dies 701, HBM dies 703, a two-dimensional array underfill material portions 850, a two-dimensional array of LSI's 952, the dielectric matrix layer 955, the TIV structures 958, the redistribution dielectric layers 922, the redistribution wiring interconnects 924, the on-interposer bump structures 938, the additional redistribution dielectric layers 922, the additional redistribution wiring interconnects 924, and the fan-out bonding pads 928. A contiguous combination of an LSI 952 and portions the dielectric matrix layer 955, the TIV structures 958, the redistribution dielectric layers 922, the redistribution wiring interconnects 924, the on-interposer bump structures 938, the additional redistribution dielectric layers 922, the additional redistribution wiring interconnects 924, and the fan-out bonding pads 928 that are located within a respective unit area constitutes a local-silicon-interconnect-containing interposer 900L, or an LSI-containing interposer 900L, which is an interposer 900 and functions in the same manner as an organic interposer 9000 described above. Each contiguous combination including an LSI-containing interposer 900L, at least one semiconductor die 701, at least one HBM die 703, an underfill material portion 850, and a molding compound die frame (which is a portion of a molding compound die frame 810M) located within a respective unit area constitutes a fan-out package 800.

Figure 14E:
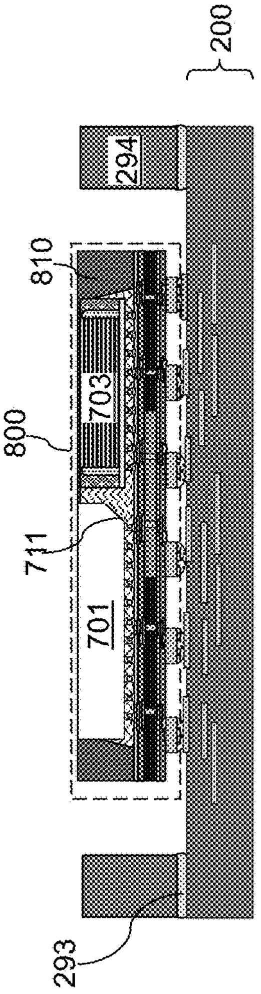

Referring to FIG. 14E, the carrier substrate 301 may be detached from the reconstituted wafer, and the reconstituted wafer may be diced into interposers 800. The processing steps described with reference to FIGS. 9-11 may be performed to attach the interposer 800 to a packaging substrate 200, and then to attach the packaging substrate 200 to a printed circuit board 100. Additional optional structures such as a stiffener ring 294 may be adhered using an adhesive 293 to the packaging substrate 200.

Figure 15A:
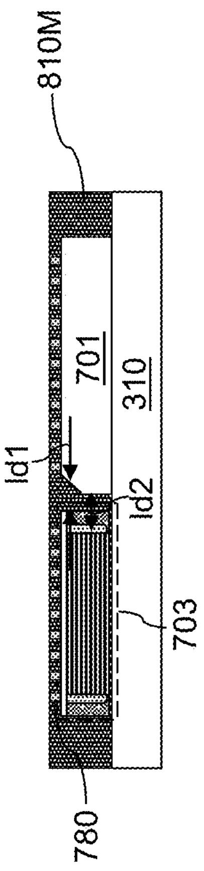
FIGS. 15A-15C are sequential vertical cross-sectional views of a fifth structure according to a fifth embodiment of the present disclosure.
Figure 15B:
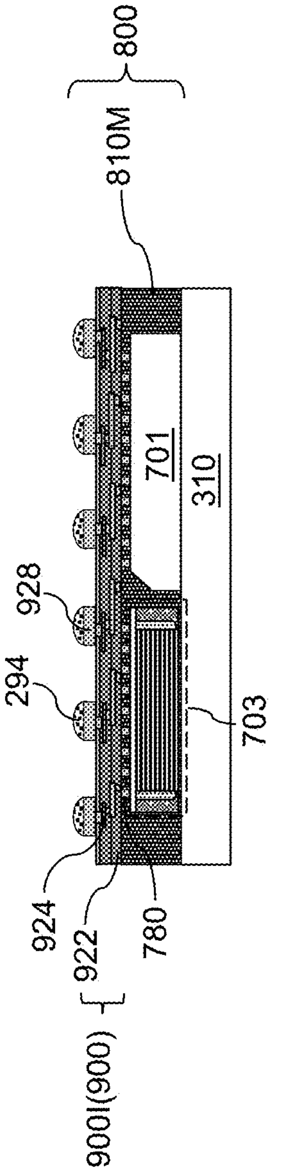
Figure 15C:
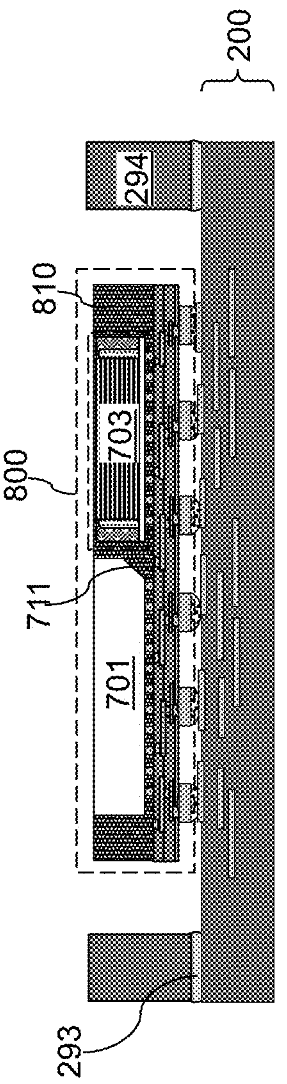

FIGS. 15A-15C are sequential vertical cross-sectional views of a fifth structure according to a fifth embodiment of the present disclosure.

Referring to FIG. 15A, at least one semiconductor die 701 and at least one HBM die 703 may be attached to a front surface of a carrier substrate 310 within each unit area of the carrier substrate 310. The planar horizontal top surfaces of the at least one semiconductor die 701 and at least one HBM die 703 may face the carrier substrate 301. For example, an adhesive layer (not shown) may be used to attach a two-dimensional array of combinations of at least one semiconductor die 701 and at least one HBM die 703 to the carrier substrate 310.

In the fifth structure, each of the semiconductor dies 701 and the HBM dies 703 may comprise on-die bump structures 780 on a respective planar horizontal bottom surface. The on-die bump structures 780 may protrude from a respective planar horizontal bottom surface of a respective die (701, 703), or may be embedded within a dielectric material layer within the respective die (701, 703) such that physically exposed surfaces of the on-die bump structures 780 are coplanar with the planar horizontal bottom surface of a respective die (701, 703). A molding compound material may be applied around the semiconductor dies 701 and the HBM dies 703, and may be planarized to form a molding compound matrix 810M. A reconstituted wafer may be formed over the carrier substrate 310. Planar surfaces of the on-die bump structures 780 may be located within a same horizontal plane as a top surface of the molding compound matrix 810M.

The molding compound matrix 810M comprises a molding compound material, which is a dielectric material. Thus, a dielectric material portion may comprise the molding compound matrix 810M may be formed directly on each sidewall of the semiconductor dies 701 and the HBM dies 703.

In one embodiment, a lateral distance ld1 between the non-horizontal, non-vertical surface segment 711 and the vertical HBM-die sidewall 731 of an adjacent HBM die 703 decreases with a vertical distance from the horizontal plane including the top surface of the molding compound matrix 810M. In one embodiment, the non-horizontal, non-vertical surface segment 711 may comprise a beveled planar surface segment that is at a constant angle with respective to a horizontal plane including the planar horizontal bottom surface 707, the constant angle being in a range from 15 degrees to 75 degrees, or a convex surface segment having a convex profile in a vertical cross-sectional view and having a straight edge in a horizontal cross-sectional view. In one embodiment, a lateral spacing between the vertical sidewall segment 712 and the vertical HBM-die sidewall 731 is in a range from 5% to 50% of a lateral distance 1*d*2 between the vertical sidewall segment 712 and most proximal sidewalls selected from sidewalls 733 of the plurality of random access memory dies 762. In one embodiment, a lateral spacing between the edge of the planar horizontal bottom surface 707 of the semiconductor die 701 and the vertical HBM-die sidewall 731 may be in a range from 50% to 200% of the lateral distance 1*d*2 between the vertical sidewall segment 712 and the most proximal sidewalls selected from the sidewalls 733 of the plurality of random access memory dies 762.

Referring to FIG. 15B, redistribution dielectric layers 922 and redistribution wiring interconnects 924 may be formed on the top surfaces of the molding compound matrix 810M such that the redistribution wiring interconnects 924 are electrically connected to the on-die bump structures 780. Subsequently, fan-out bonding pads 928 and second solder material portions 294 may be formed on the backside of the redistribution dielectric layers 922 and the redistribution wiring interconnects 924.

A reconstituted wafer is formed, which comprises The reconstituted wafer comprises the redistribution dielectric layers 922, the redistribution wiring interconnects 924, the fan-out bonding pads 928, the semiconductor dies 701, the HBM dies 703, the underfill material portions 850, and the molding compound matrix 810M. Each portion of the combination of the redistribution dielectric layers 922, the redistribution wiring interconnects 924, and the fan-out bonding pads 928 that is located within a respective unit area constitutes an organic interposer 9000, which is an interposer 900 and functions in the same manner as an organic interposer 9000 described above. Each contiguous combination including an organic interposer 9000, at least one semiconductor die 701, at least one HBM die 703, an underfill material portion 850, and a molding compound die frame (which is a portion of a molding compound matrix 810M) located within a respective unit area constitutes a fan-out package 800.

Referring to FIG. 15C, the carrier substrate 301 may be detached from the reconstituted wafer, and the reconstituted wafer may be diced into interposers 800. The processing steps described with reference to FIGS. 9-11 may be performed to attach the interposer 800 to a packaging substrate 200, and then to attach the packaging substrate 200 to a printed circuit board 100. Additional optional structures such as a stiffener ring 294 may be adhered using an adhesive 293 to the packaging substrate 200.

Figure 16:
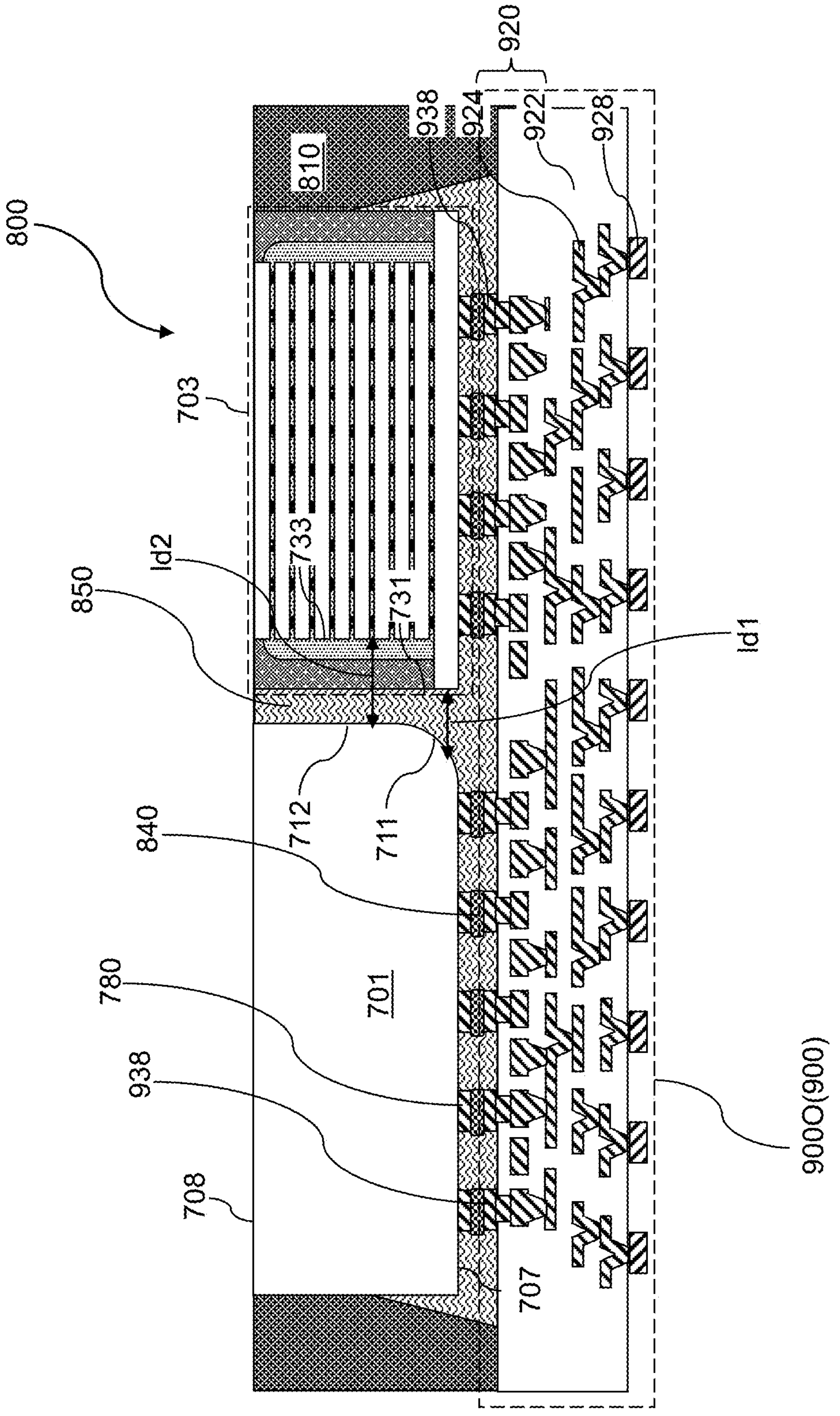
FIG. 16 is a vertical cross-sectional view of a first alternative configuration of a fan-out package according to an embodiment of the present disclosure.

Referring to FIG. 16, a first alternative configuration of a fan-out package 800 according to an embodiment of the present disclosure is illustrated. The first alternative configuration of the fan-out package 800 may be derived from any of the configurations for the fan-out package 800 described above by using a convex surface segment having a convex profile in a vertical cross-sectional view and having a straight edge in a horizontal cross-sectional view as one, a plurality, and/or each of the at least one non-horizontal, non-vertical surface segment 711 of one or more semiconductor dies 701 in any of the above-described structures.

Figure 17A:
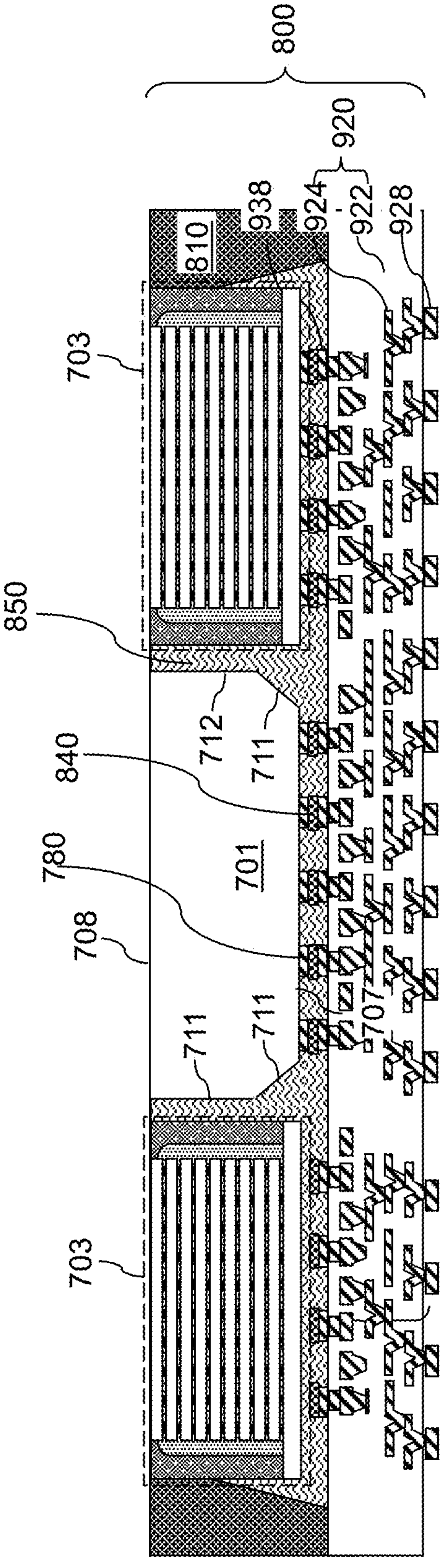
FIG. 17A is a vertical cross-sectional view of a second alternative configuration of a fan-out package according to an embodiment of the present disclosure.
Figure 17B:
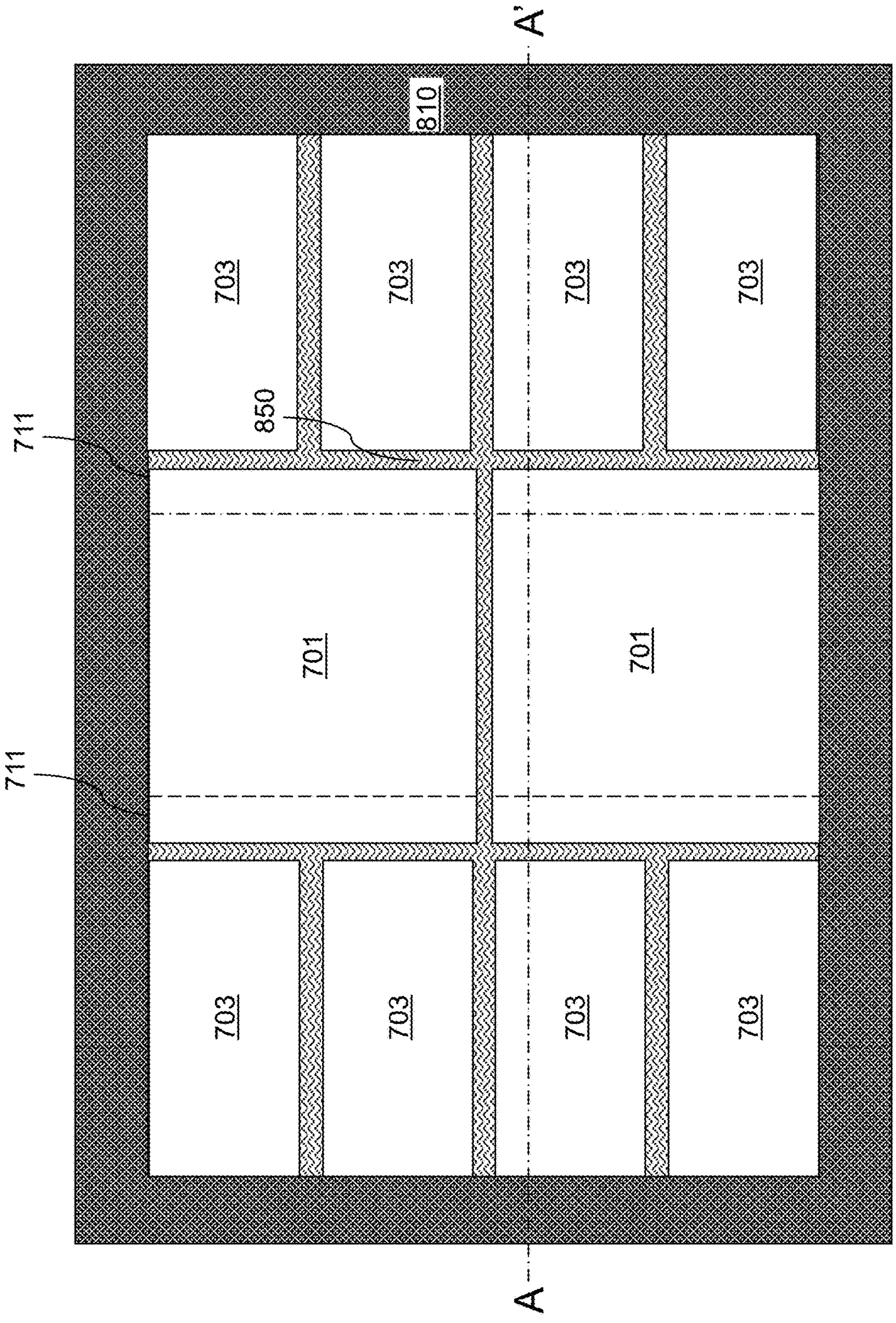
FIG. 17B is a top-down view of the second alternative configuration of the fan-out package of FIG. 17A.

Referring to FIGS. 17A and 17B, a second alternative configuration of a fan-out package 800 according to an embodiment of the present disclosure is illustrated. The second alternative configuration of the fan-out package 800 may be derived from any of the configurations for the fan-out package 800 described above by rearranging the HBM dies 703 such that at least one first HBM die 703 is located on a first side of the at least one semiconductor die 701 and at least one second HBM die is located on a second side of the at least one semiconductor die 701. The second side may, or may not, the opposite side of the first side. In this embodiment, one, a plurality, and/or each of the at least one semiconductor die 701 may comprise two or more contoured sidewalls (711, 712). Each of the two or more contoured sidewalls (711, 712) comprises a respective non-horizontal, non-vertical surface segment 711, which may be a beveled surface segment or a convex surface segment. In one embodiment, the at least one semiconductor die 701 may comprise a plurality of semiconductor dies 701. In one embodiment, one or more of the at least one semiconductor die 701 may comprise at least one vertical semiconductor-die sidewall 722 that vertically extends from a planar horizontal bottom surface 707 to a planar horizontal top surface 708 of a respective semiconductor die 701. Locations of the non-horizontal, non-vertical surface segments 711 are identified with the aid of dotted lines in the top-down view of FIG. 17B.

In this embodiment, at least one semiconductor die 701 as provided at the processing steps of FIGS. 2A-2C may be further process to form at least one additional contoured sidewall (711, 712) on the respective semiconductor die 701. The additional contoured sidewall (711, 712) comprises an additional vertical sidewall segment 712 and an additional non-horizontal, non-vertical surface segment 711 that is adjoined to a bottom edge of the additional vertical sidewall segment 712 and is adjoined to another edge of the planar horizontal bottom surface 707. At least one additional HBM die 703 may be attached to the interposer 900 such that the additional contoured sidewall (711, 712) faces the at least one additional HBM die 703.

Figure 18:
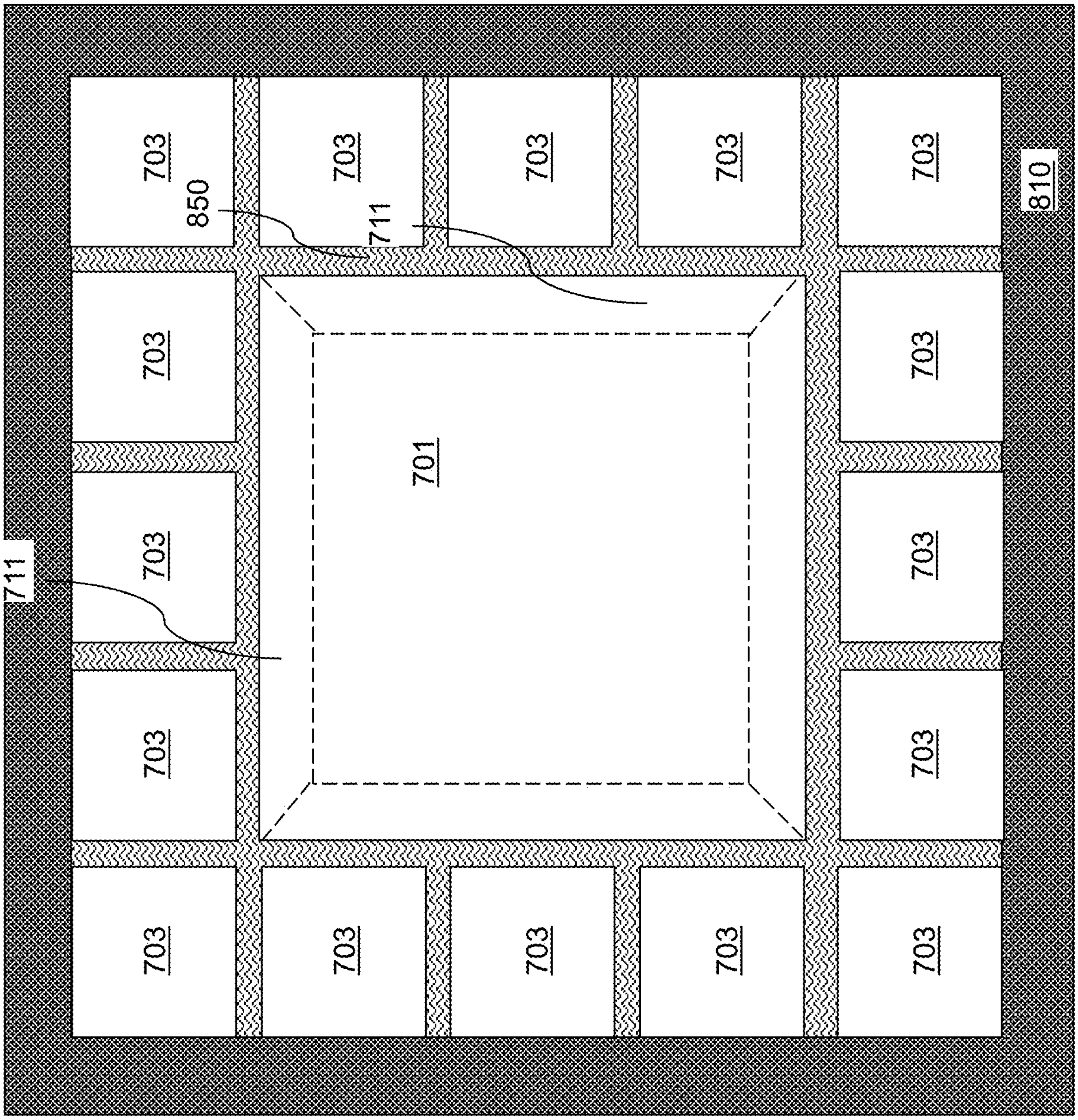
FIG. 18 is a top-down view of a third alternative configuration of a fan-out package according to an embodiment of the present disclosure.

Referring to FIG. 18, a third alternative configuration of a fan-out package 800 according to an embodiment of the present disclosure is illustrated. The third alternative configuration of the fan-out package 800 may be derived from any of the configurations for the fan-out package 800 described above by rearranging the HBM dies 703 such that at least one HBM die 703 is located on each side of a semiconductor die 701. In this embodiment, each sidewall of the semiconductor die 701 may be a contoured sidewall (711, 712). Locations of the non-horizontal, non-vertical surface segments 711 are identified with the aid of dotted lines in the top-down view of FIG. 18.

Figure 19:
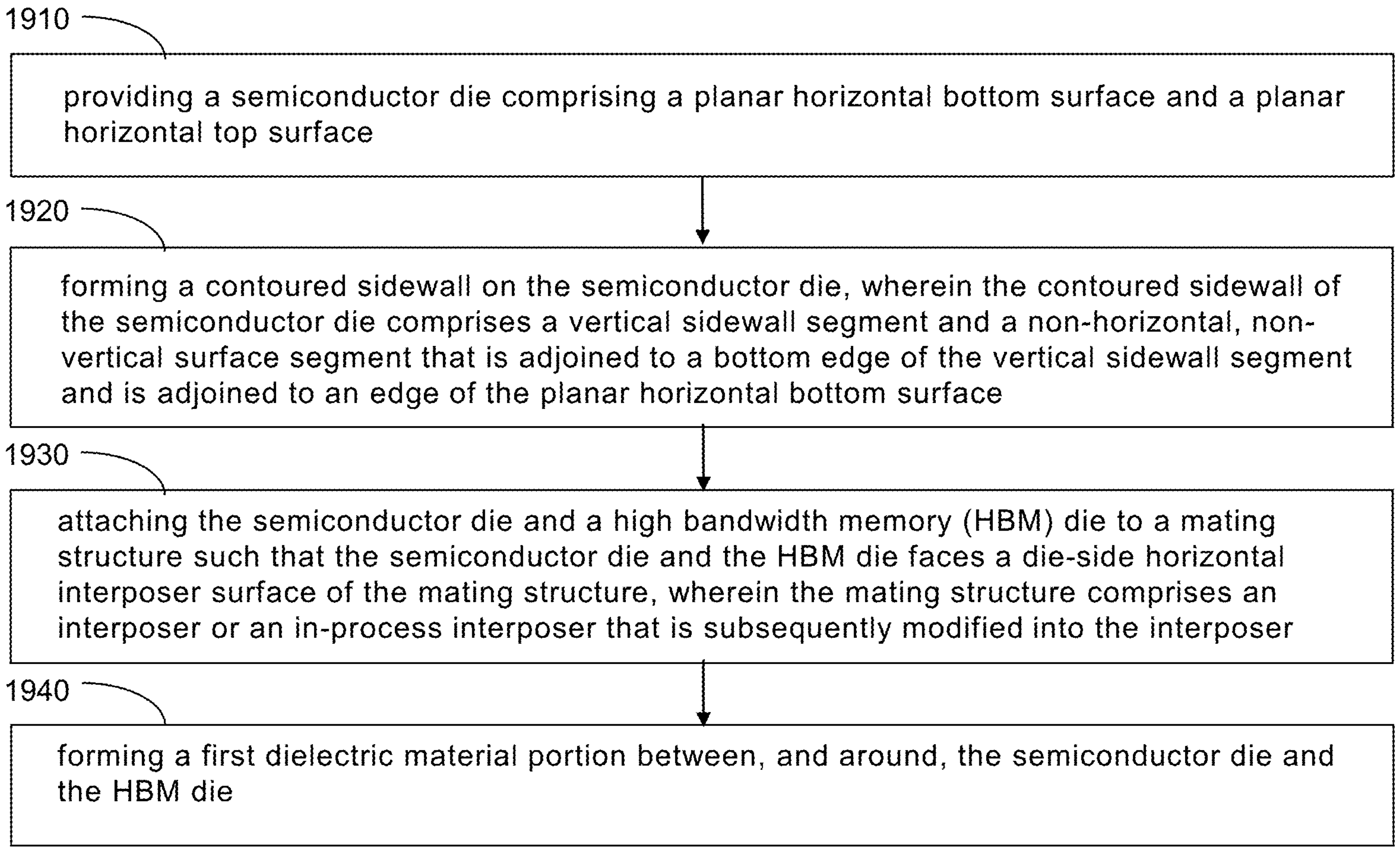
FIG. 19 is a first flowchart illustrating steps for forming a bonded assembly according to an embodiment of the present disclosure.

Referring to FIG. 19, a first flowchart illustrates steps for forming a bonded assembly according to an embodiment of the present disclosure.

Referring to step 1910 and FIGS. 1A-1C, a semiconductor die 701 comprising a planar horizontal bottom surface 707 and a planar horizontal top surface 708 is provided.

Referring to step 1920 and FIGS. 2A-2C, 12A, 13A, 14A and 14B, 16, 17A and 17B, and 18, a contoured sidewall (711, 712) may be formed on the semiconductor die 701. The contoured sidewall (711, 712) of the semiconductor die 701 comprises a vertical sidewall segment 712 and a non-horizontal, non-vertical surface segment 711 that is adjoined to a bottom edge of the vertical sidewall segment 712 and is adjoined to an edge of the planar horizontal bottom surface 707.

Referring to step 1930 and FIGS. 3, 4A and 4B, 12A, 13A, 14A and 14B, 16, 17A and 17B, and 18, the semiconductor die 701 and a high bandwidth memory (HBM) die 703 may be attached to a mating structure such that the semiconductor die 701 and the HBM die 703 faces a die-side horizontal interposer surface 901 of the mating structure. The contoured sidewall (711, 712) of the semiconductor die 701 faces the HBM die 703. The mating structure comprises an interposer 900 or an in-process interposer that is subsequently modified into the interposer 900.

Referring to step 1940 and FIGS. 5A-14E and 16-18, a dielectric material portion (850 or 810) is formed between, and around, the semiconductor die 701 and the HBM die 703. The dielectric material portion (850 or 810) may comprise an underfill material portion 850 or a molding compound die frame 810.

Figure 20:
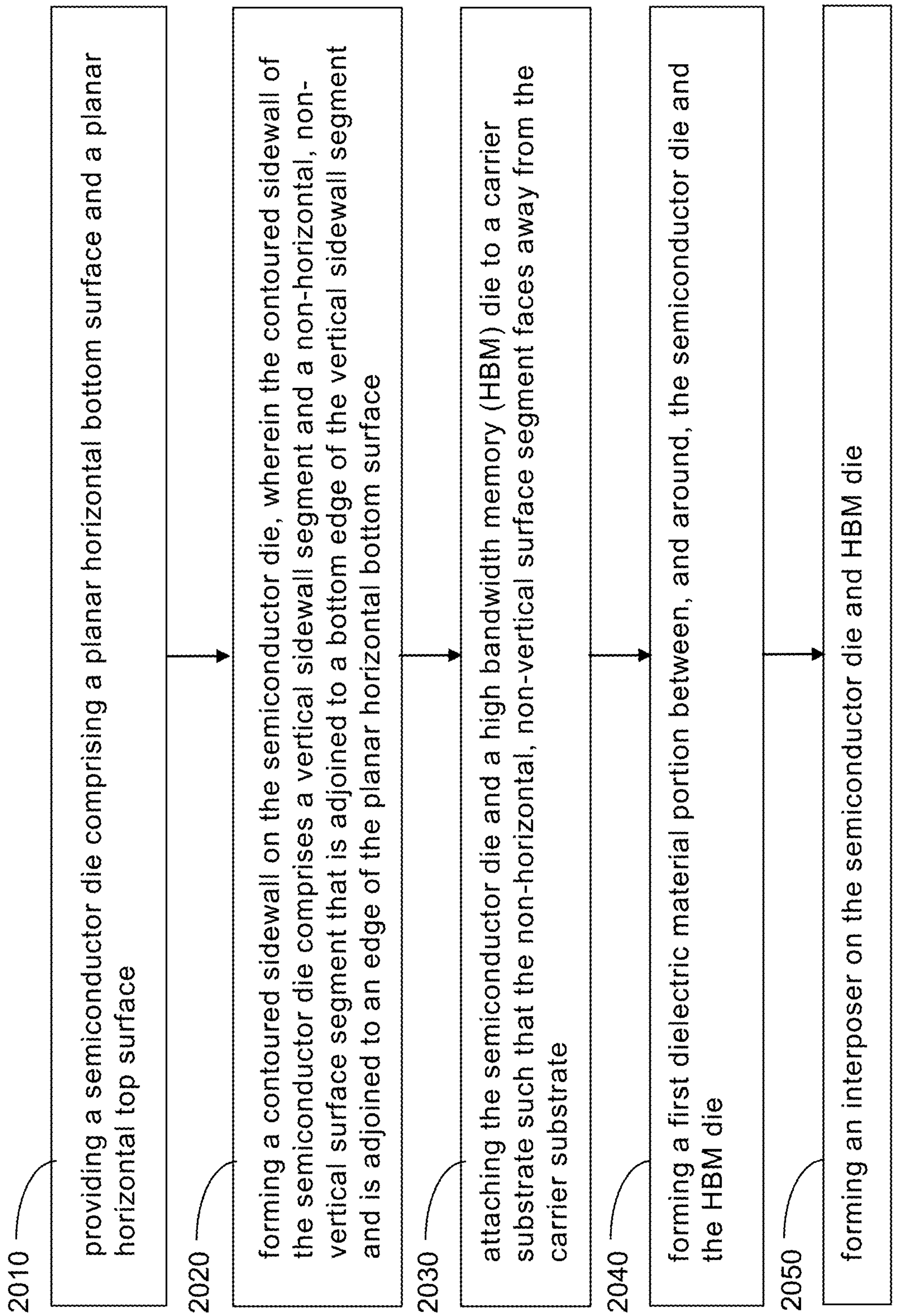
FIG. 20 is a second flowchart illustrating steps for forming a bonded assembly according to an embodiment of the present disclosure.

Referring to FIG. 20, a second flowchart illustrates steps for forming a bonded assembly according to an embodiment of the present disclosure.

Referring to step 2010 and FIGS. 1A-1C, a semiconductor die 701 comprising a planar horizontal bottom surface 707 and a planar horizontal top surface 708 is provided.

Referring to step 2020 and FIGS. 2A-2C, 15A, 16, 17A and 17B, and 18, a contoured sidewall (711, 712) may be formed on the semiconductor die 701. The contoured sidewall (711, 712) of the semiconductor die 701 comprises a vertical sidewall segment 712 and a non-horizontal, non-vertical surface segment 711 that is adjoined to a bottom edge of the vertical sidewall segment 712 and is adjoined to an edge of the planar horizontal bottom surface 707.

Referring step 2030 and FIGS. 15A, 16, 17A and 17B, and 18, the semiconductor die 701 and a high bandwidth memory (HBM) die 703 are attached to a carrier substrate 301 such that the non-horizontal, non-vertical surface segment 711 faces away from the carrier substrate 301.

Referring to step 2040 and FIGS. 15A, 16, 17A and 17B, and 18, a dielectric material portion (such as molding compound matrix 810M) is formed between, and around, the semiconductor die 701 and the HBM die 703. In one embodiment, the dielectric material portion comprises a molding compound material.

Referring to step 2050 and FIGS. 15B and 15C, 16, 17A and 17B, and 18, an interposer 900 is formed on the semiconductor die 701 and HBM die 703. In one embodiment, the carrier substrate 301 may be detached after formation of the interposer 900. An assembly of the interposer 900, the semiconductor die 701, and the HBM die 703 may be subsequently attached to a packaging substrate 200.

Referring to all drawings and according to various embodiments of the present disclosure, a bonded assembly is provided, which comprises: an interposer 900 including a die-side horizontal interposer surface 901; a semiconductor die 701 that is attached to the interposer 900, wherein the semiconductor die 701 comprises a bottom surface 707 facing, or contacting, the first horizontal surface 901 and comprises a contoured sidewall (711, 712); a high bandwidth memory (HBM) die 703 that is attached to the interposer 900 and having a sidewall 731 that faces the contoured sidewall (711, 712) of the semiconductor die 701; and a dielectric material portion (850 or 810) contacting the semiconductor die 701 and the interposer 900, wherein the contoured sidewall (711, 712) of the semiconductor die 701 comprises a vertical sidewall segment 712 and a non-horizontal, non-vertical surface segment 711 that is adjoined to a bottom edge of the vertical sidewall segment 712 and is adjoined to an edge of the bottom surface 707 of the semiconductor die 701; and the vertical sidewall segment 712 and the non-horizontal, non-vertical surface segment 711 are in contact with the dielectric material portion (850 or 810).

In one embodiment, a lateral distance ld1 between the non-horizontal, non-vertical surface segment 711 and the sidewall 731 of the HBM-die decreases with a vertical distance from the die-side horizontal interposer surface 901.

In one embodiment, the non-horizontal, non-vertical surface segment 711 comprises: a beveled planar surface segment that is at a constant angle with respective to a horizontal plane including the bottom surface 707, the constant angle being in a range from 15 degrees to 75 degrees; or a convex surface segment having a convex profile in a vertical cross-sectional view and having a straight edge in a horizontal cross-sectional view.

In one embodiment, the HBM die 703 is attached to the interposer 900 through an array of solder material portions 840; and the dielectric material portion (850 or 810) comprises an underfill material portion 850 containing a filler material therein.

In one embodiment, the bonded assembly comprises a molding compound die frame 810 laterally surrounding the underfill material portion 850, the semiconductor die 701, and the HBM die 703.

In one embodiment, the HBM die 703 comprises on-die bump structures 780 that are bonded to metal bonding structures located within the interposer 900; and the dielectric material portion (850 or 810) comprises a molding compound die frame 810 contacting, and laterally surrounding, the semiconductor die 701 and the HBM die 703.

In one embodiment, the HBM die 703 comprises: a controller die 761 having a first lateral extent LE1; and a plurality of random access memory dies 762 that are stacked over the controller die 761 and having a second lateral extent LE2 that is less than the first lateral extent LE1, wherein the controller die 761 and the plurality of random access memory dies 762 are interconnected to one another by arrays of bump structures 770.

In one embodiment, the HBM die 703 comprises: at least one HBM underfill material portion 772 laterally surrounding the arrays of bump structures 770; and an HBM molding compound matrix 776 laterally surrounding the plurality of random access memory dies 762, wherein: sidewalls of the HBM molding compound matrix 776 are vertically coincident with sidewalls of the controller die 761; and the sidewall 731 of the HBM die comprises one of the sidewalls of the HBM molding compound matrix 776 and one of the sidewalls of the controller die 761.

In one embodiment, a lateral spacing between the vertical sidewall segment 712 and the vertical HBM-die sidewall 731 is in a range from 5% to 50% of a lateral distance 1*d*2 between the vertical sidewall segment 712 and most proximal sidewalls selected from sidewalls 733 of the plurality of random access memory dies 762; and a lateral spacing between the edge of the bottom surface 707 of the semiconductor die 701 and the sidewall 731 of the HBM die is in a range from 50% to 200% of the lateral distance between the vertical sidewall segment 712 and the most proximal sidewalls selected from sidewalls of the plurality of random access memory dies 762.

In one embodiment, the contoured sidewall (711, 712) vertically extends from the bottom surface 707 to a top surface 708 of the semiconductor die 701; and the semiconductor die 701 further comprises a vertical semiconductor-die sidewall 722 that vertically extends from the planar horizontal bottom surface 707 to the planar horizontal top surface 708 and does not face the vertical HBM-die sidewall 731.

In one embodiment, the bonded assembly comprises at least one additional HBM die 703 having an additional vertical HBM-die sidewall 731. The semiconductor die 701 comprises an additional contoured sidewall (711, 712) that faces the additional vertical HBM-die sidewall 731; and the additional contoured sidewall (711, 712) of the semiconductor die 701 comprises an additional vertical sidewall segment 712 and an additional non-horizontal, non-vertical surface segment 711 that is adjoined to a bottom edge of the additional vertical sidewall segment 712 and is adjoined to another edge of the planar horizontal bottom surface 707 of the semiconductor die 701.

In one embodiment, a molding compound die frame 810 laterally surrounds the semiconductor die 701 and the HBM die 703; the molding compound die frame 810 comprises the dielectric material portion (850 or 810) or laterally surrounds the dielectric material portion (850 or 810); sidewalls of the molding compound die frame 810 are vertically coincident with sidewalls of the interposer 900; and the bonded assembly further comprises a packaging substrate that is attached to the interposer 900 through an array of solder material portions 840.

The various embodiments of the present disclosure may be used to maintain a minimum level of spacing between hard materials of a semiconductor die 701 and an adjacent HBM die 703. The hard materials of the semiconductor die 701 and the adjacent HBM die 703 may comprise semiconductor substrates in the semiconductor die 701, a semiconductor substrate of the controller die 761 in the adjacent HBM die 703, and semiconductor substrates in the random access memory dies 762 in the adjacent HBM die 703. In contrast, the at least one HBM underfill material portion 772, the HBM molding compound matrix 776, and the underfill material portion 850 (or the molding compound die frame 810) comprise soft materials having a smaller Young's modulus than the semiconductor substrates in the semiconductor die 701, the controller die 761, and the random access memory dies 762. Thus, the spacing between the hard materials in the assembly is the lesser of the distance between the contoured sidewall (711, 712) of the semiconductor die 701 and a proximal sidewall of the controller die 761 and the distance between the contoured sidewall (711, 712) of the semiconductor die 701 and proximal sidewalls of the random access memory dies 762. By using a non-horizontal, non-vertical surface segment 711 within the contoured sidewall (711, 712), the spacing between the hard materials of adjacent dies may be increased, and cracking or delamination due to stress may be reduced. In one embodiment, the lateral spacing between hard surfaces of neighboring dies (701, 703) may be greater than 150 microns at any vertical distance from an interposer 900. In one embodiment, the lateral spacing between hard surfaces of neighboring dies (701, 703) may be in a range from 150 microns to 600 microns. By suppressing cracking and/or delamination of the dielectric material (such as an underfill material or a molding compound material) between a semiconductor die 701 and each neighboring HBM die 703, reliability of the chip package including the semiconductor die 701 and the HBM die may be increased. In one embodiment, unnecessary processing costs for formation of unnecessary non-horizontal, non-vertical sidewall segments may be avoided by forming a contoured sidewall (711, 712) only on a side, or only on sides, of the semiconductor die 701 that face(s) a respective HBM die 703. In this embodiment, at least one un-modified planar vertical sidewall, i.e., at least one vertical semiconductor-die sidewall 722, may be provide on each side of the semiconductor die 701 that does not face any HBM die 703.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a bonded assembly, comprising:

providing a semiconductor die comprising a bottom surface and a top surface;

forming a contoured sidewall on the semiconductor die, wherein the contoured sidewall of the semiconductor die comprises a vertical sidewall segment and a non-horizontal, non-vertical surface segment that is adjoined to a bottom edge of the vertical sidewall segment and is adjoined to an edge of the bottom surface;

attaching the semiconductor die and a high bandwidth memory (HBM) die to a mating structure such that the semiconductor die and the HBM die faces a first surface of the mating structure, wherein the mating structure comprises an interposer or an in-process interposer that is subsequently modified into the interposer, wherein the contoured sidewall of the semiconductor die faces the HBM die such that the contoured sidewall creates a variable lateral spacing between the semiconductor die and the HBM die to reduce local stress in the HBM die proximal to the mating structure, wherein the variable lateral spacing comprises a minimum gap distance proximal to the mating structure and a maximum gap distance distal from the mating structure, and wherein the maximum gap distance is at least 1.5 times the minimum gap distance; and forming a dielectric material portion between, and around, the semiconductor die and the HBM die.

2. The method of claim 1, wherein the dielectric material portion is applied directly on the vertical sidewall segment, the non-horizontal, non-vertical surface segment, and sidewalls of the HBM die.

3. The method of claim 1, wherein the non-horizontal, non-vertical surface segment is formed as:

a beveled planar surface segment that is at a constant angle with respective to a horizontal plane including the bottom surface, the constant angle being in a range from 15 degrees to 75 degrees; or a convex surface segment having a convex profile in a vertical cross-sectional view and having a straight edge in a horizontal cross-sectional view.

4. The method of claim 1, wherein:

the HBM die is attached to the interposer through an array of solder material portions;

the dielectric material portion comprises an underfill material portion containing a filler material therein; and the method comprises applying a molding compound material around the underfill material portion, the semiconductor die, and the HBM die.

5. The method of claim 1, wherein:

the HBM die comprises on-die bump structures;

the method comprises bonding the on-die bump structures to metal bonding structures located within the interposer via metal-to-metal bonding; and the dielectric material portion comprises a molding compound material.

6. The method of claim 1, further comprising:

forming an additional contoured sidewall on the semiconductor die, wherein the additional contoured sidewall comprises an additional vertical sidewall segment and an additional non-horizontal, non-vertical surface segment that is adjoined to a bottom edge of the additional vertical sidewall segment and is adjoined to another edge of the planar horizontal bottom surface; and attaching an additional HBM die to the interposer such that the additional contoured sidewall faces the additional HBM die.

7. A method of forming a bonded assembly, comprising:

providing a first semiconductor die comprising a planar horizontal bottom surface and a top surface;

forming a contoured sidewall on the first semiconductor die, wherein the contoured sidewall of the first semiconductor die comprises a vertical sidewall segment and a non-horizontal, non-vertical surface segment that is adjoined to a bottom edge of the vertical sidewall segment and is adjoined to an edge of the planar horizontal bottom surface;

attaching the first semiconductor die and a second semiconductor die to a mating structure such that the first semiconductor die and the second semiconductor die faces a first surface of the mating structure, wherein the mating structure comprises an interposer or an in-process interposer that is subsequently modified into the interposer, wherein the contoured sidewall of the first semiconductor die faces the second semiconductor die such that the contoured sidewall creates a variable lateral spacing between the first semiconductor die and the second semiconductor die to reduce local stress in the second semiconductor die proximal to the mating structure, wherein the variable lateral spacing comprises a minimum gap distance proximal to the mating structure and a maximum gap distance distal from the mating structure, and wherein the maximum gap distance is at least 1.5 times the minimum gap distance; and forming a dielectric material portion between, and around, the first semiconductor die and the second semiconductor die.

8. The method of claim 7, wherein the dielectric material portion is applied directly on the vertical sidewall segment, the non-horizontal, non-vertical surface segment, and sidewalls of the second semiconductor die.

9. The method of claim 7, wherein the non-horizontal, non-vertical surface segment is formed as a beveled planar surface segment that is at a constant angle with respective to a horizontal plane, the constant angle being in a range from 15 degrees to 75 degrees.

10. The method of claim 7, wherein the non-horizontal, non-vertical surface segment is formed such that the non-horizontal, non-vertical surface segment extends inward toward a central region of the first semiconductor die from the vertical sidewall segment to the planar horizontal bottom surface.

11. The method of claim 7, wherein a first horizontal dimension of the first semiconductor die measured at the edge of the planar horizontal bottom surface is greater than a second horizontal dimension of the first semiconductor die measured at the bottom edge of the vertical sidewall segment.

12. The method of claim 7, wherein a vertical height of the non-horizontal, non-vertical surface segment is less than 20% of a vertical height of the vertical sidewall segment.

13. A method of forming a bonded assembly, comprising:

providing a first semiconductor die, the first semiconductor die comprising a contoured sidewall, the contoured sidewall being a side surface that comprises a non-perpendicular segment relative to a primary surface of the first semiconductor die;

attaching the first semiconductor die and a second semiconductor die to a mating structure via an array of bonding structures, wherein the mating structure comprises an interposer or an in-process interposer that is subsequently modified into the interposer, wherein the primary surface of the first semiconductor die is attached substantially parallel to a major surface of the mating structure, and wherein the first semiconductor die and the second semiconductor die are laterally positioned such that the contoured sidewall creates a variable lateral spacing between the first semiconductor die and the second semiconductor die to reduce local stress in the second semiconductor die proximal to the mating structure, wherein the variable lateral spacing comprises a minimum gap distance proximal to the mating structure and a maximum gap distance distal from the mating structure, and wherein the maximum gap distance is at least 1.5 times the minimum gap distance;

forming a first underfill material portion between the first semiconductor die and the mating structure, and between the second semiconductor die and the mating structure; and forming a molding compound material to laterally surround the first semiconductor die and the second semiconductor die, wherein the molding compound material is in direct contact with the contoured sidewall of the first semiconductor die.

14. The method of claim 13, wherein the contoured sidewall is tapered such that a lateral dimension of the first semiconductor die decreases from the mating structure toward a top surface of the first semiconductor die.

15. The method of claim 13, wherein the non-perpendicular segment of the contoured sidewall is formed to have a taper angle in a range from 1 degree to 20 degrees with respect to a vertical direction.

16. The method of claim 13, wherein the contoured sidewall comprises a vertical segment proximal to the mating structure and an outwardly sloped segment distal from the mating structure.

17. The method of claim 13, wherein the non-perpendicular segment of the contoured sidewall is oriented such that the portion of the sidewall nearest the second semiconductor die forms an acute angle with the major surface of the mating structure.

18. The method of claim 13, wherein the variable lateral spacing between the first semiconductor die and the second semiconductor die increases monotonically with distance from the mating structure.

19. The method of claim 13, wherein the contoured sidewall is formed with a fillet radius connecting the sidewall to the top surface of the first semiconductor die.

20. The method of claim 13, wherein the:

the second semiconductor die comprises a high bandwidth memory (HBM) die;

the mating structure comprises the in-process interposer; and the interposer is adjoined to a plurality of additional in-process interposers and located on a carrier substrate.

* * * * *